US012058891B2

(12) United States Patent
Ito

(10) Patent No.: US 12,058,891 B2
(45) Date of Patent: Aug. 6, 2024

(54) DISPLAY DEVICE THAT ALLEVIATES LIMITATIONS IN MATERIALS

(71) Applicant: SHARP KABUSHIKI KAISHA, Sakai (JP)

(72) Inventor: Kazuatsu Ito, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 652 days.

(21) Appl. No.: 17/276,423

(22) PCT Filed: Sep. 18, 2018

(86) PCT No.: PCT/JP2018/034509
§ 371 (c)(1),
(2) Date: Mar. 15, 2021

(87) PCT Pub. No.: WO2020/059026
PCT Pub. Date: Mar. 26, 2020

(65) Prior Publication Data
US 2022/0059632 A1 Feb. 24, 2022

(51) Int. Cl.
*H10K 59/121* (2023.01)
*H01L 29/66* (2006.01)
*H01L 29/786* (2006.01)
*H10K 59/12* (2023.01)

(52) U.S. Cl.
CPC ... *H10K 59/1213* (2023.02); *H01L 29/66742* (2013.01); *H01L 29/7869* (2013.01); *H01L 29/78696* (2013.01); *H10K 59/1201* (2023.02)

(58) Field of Classification Search
CPC .................... H10K 59/1213; H01L 29/66742
See application file for complete search history.

(56) References Cited

U.S. PATENT DOCUMENTS

| 2016/0322416 | A1 | 11/2016 | Nara |
| 2017/0236843 | A1* | 8/2017 | Chong ................ H01L 27/1259 257/43 |
| 2018/0261698 | A1* | 9/2018 | Lim .................. H01L 29/66969 |
| 2019/0318924 | A1* | 10/2019 | Yamazaki ......... H01L 21/02211 |

FOREIGN PATENT DOCUMENTS

JP 2016-213432 A 12/2016

* cited by examiner

*Primary Examiner* — Jay C Chang
*Assistant Examiner* — Mikka Liu
(74) *Attorney, Agent, or Firm* — ScienBiziP, P.C.

(57) ABSTRACT

A display device includes a gate electrode, a gate insulating film, a first metal oxide layer having crystallinity, and a second metal oxide layer having non-crystallinity. The first metal oxide layer and the second metal oxide layer are sequentially laminated on a substrate. The first metal oxide layer and the second metal oxide layer are in contact with each other in all regions where the first metal oxide layer and the second metal oxide layer overlap each other. The first metal oxide layer at least partially has a first semiconductor region serving as a semiconductor. One of the first metal oxide layer and the second metal oxide layer at least partially has a conductor region made electrically conductive.

20 Claims, 31 Drawing Sheets

DISPLAY DEVICE THAT ALLEVIATES LIMITATIONS IN MATERIALS

TECHNICAL FIELD

The disclosure relates to a display device including transistors and a manufacturing method of the display device.

BACKGROUND ART

In recent years, along with advances in Organic Light Emitting Diode (OLED) technology, products provided with organic Electro Luminescence (EL) display devices have become widespread. Typically, in an organic EL display device, a configuration including a pixel circuit configured to supply a current to a pixel in a light-emitting layer is used, and normally, the pixel circuit is manufactured with a patterning process of forming a metal film on a substrate and patterning the metal film included. In the patterning of the metal film, a resist film formed on the metal film is exposed and developed by photolithography (a photo process), and etching is performed by applying the developed resist film as an etching mask.

Incidentally, a semiconductor element such as the OLED is formed by laminating a plurality of layers, and there is a concern that etching for a predetermined layer affects a lower layer. As a countermeasure to the above, for example, it has been proposed to provide an etch stop layer in a lower layer of an opening formed by etching (for example, see PTL 1).

CITATION LIST

Patent Literature

PTL 1: JP 2016-213432 A

SUMMARY

Technical Problem

A semiconductor element disclosed in PTL 1 includes a thin film transistor provided with an opening at a position containing a channel region of an oxide semiconductor layer, and includes an etch stop layer directly on the channel region. In the semiconductor element described above, the etch stop layer can prevent etching of the lower layer from generating, but there is a problem that there is a limitation to employ a technique by which the etch stop layer is not etched. In addition, there is a problem that a manufacturing process is made complicated in order to form the etch stop layer at a specific position.

The disclosure has been conceived in order to solve the problems described above, and an object of the disclosure is to provide a display device and a manufacturing method of the display device that alleviate limitations in materials, a manufacturing process, and the like, and that improve the degree of freedom in designing transistors.

Solution to Problem

A display device according to the disclosure is a display device including a transistor, in which the transistor includes a gate electrode, a gate insulating film, a first metal oxide layer having crystallinity, and a second metal oxide layer having non-crystallinity, the first metal oxide layer and the second metal oxide layer are laminated on a substrate in this order, the first metal oxide layer and the second metal oxide layer are in contact with each other in all regions where the first metal oxide layer and the second metal oxide layer overlap each other, the first metal oxide layer at least partially has a first semiconductor region serving as a semiconductor, and one of the first metal oxide layer and the second metal oxide layer at least partially has a conductor region made electrically conductive.

The display device according to the disclosure may have a configuration in which the first metal oxide layer is formed of a ternary oxide semiconductor containing at least tungsten or tin.

The display device according to the disclosure may have a configuration in which the second metal oxide layer is formed of a ternary oxide semiconductor containing at least tungsten or tin.

The display device according to the disclosure may have a configuration in which the first metal oxide layer and the second metal oxide layer are formed of an identical material.

The display device according to the disclosure may have a configuration in which the second metal oxide layer at least partially has a second semiconductor region serving as a semiconductor.

The display device according to the disclosure may have a configuration in which each of the first metal oxide layer and the second metal oxide layer has the conductor region, the second semiconductor region is divided into a source region side and a drain region side so as to be paired with the conductor region in the second metal oxide layer, and an edge between the conductor region and the second semiconductor region in the second metal oxide layer matches an edge between the conductor region and the first semiconductor region in the first metal oxide layer.

The display device according to the disclosure may have a configuration in which the first metal oxide layer has the conductor region, the first semiconductor region is divided into a source region side and a drain region side so as to be paired with the conductor region in the first metal oxide layer, and at least a part of the second semiconductor region is sandwiched between the first semiconductor region on the source region side and the first semiconductor region on the drain region side.

The display device according to the disclosure may have a configuration in which an edge between the conductor region and the first semiconductor region in the first metal oxide layer matches an edge of the second metal oxide layer.

The display device according to the disclosure may have a configuration in which the second metal oxide layer has the conductor region, and an edge between the conductor region and the first semiconductor region in the first metal oxide layer matches an edge between the conductor region and the second semiconductor region in the second metal oxide layer.

The display device according to the disclosure may have a configuration in which the first metal oxide layer is sandwich between the substrate and the gate electrode, and the first semiconductor region has a shape matching the gate electrode.

The display device according to the disclosure may have a configuration in which the second semiconductor region has a shape matching the gate electrode.

The display device according to the disclosure may have a configuration in which the gate electrode is sandwiched between the substrate and the first metal oxide layer, and in a channel length direction in which a source region and a drain region face each other, a width of the gate electrode is larger than a width of the first semiconductor region or the second semiconductor region.

The display device according to the disclosure may include an interlayer insulating film and a terminal electrode laminated on the second metal oxide layer, and may have a configuration in which the terminal electrode is electrically connected to the conductor region through a contact hole formed in the interlayer insulating film.

The display device according to the disclosure may include a first transistor and a second transistor as a plurality of the transistors provided on the substrate, and may have a configuration in which in the first transistor, the second semiconductor region is divided into a source region side and a drain region side, and the first semiconductor region positioned between the divided second semiconductor regions serves as a channel region, and in the second transistor, the first semiconductor region is divided into a source region side and a drain region side, and the second semiconductor region positioned between the divided first semiconductor regions serves as a channel region.

The display device according to the disclosure may have a configuration in which the first transistor serves as a write transistor, and the second transistor serves as a drive transistor.

The display device according to the disclosure may have a configuration in which the second transistor serves as an initialization transistor configured to initialize a voltage of the drive transistor, and the second transistor serves as a threshold voltage compensation transistor configured to compensate for a threshold voltage of the drive transistor.

A manufacturing method of a display device according to the disclosure is a manufacturing method of a display device including a transistor formed on a substrate, and the manufacturing method includes first film forming of forming a first metal oxide layer having non-crystallinity on the substrate, first film etching of etching the first metal oxide layer, crystallizing of crystallizing the first metal oxide layer, second film forming of forming a second metal oxide layer having non-crystallinity on the first metal oxide layer, second film etching of etching the second metal oxide layer, gate forming of forming a gate insulating layer and a gate electrode on the substrate, and a conductor forming of making at least a part of one of the first metal oxide layer and the second metal oxide layer conductive.

The manufacturing method of the display device according to the disclosure may have a configuration in which the first metal oxide layer and the second metal oxide layer are formed of an identical material, and an identical etchant is used in the first film etching and the second film etching.

Advantageous Effects of Disclosure

According to the disclosure, a selection ratio in etching can be obtained by overlapping metal oxides each other having different crystallinity and making a difference in etching resistance. Utilizing this characteristic can mitigate limitations in materials, a manufacturing process, and the like, and can increase the degree of freedom in designing transistors.

DESCRIPTION OF EMBODIMENTS

First Embodiment

With reference to the drawings, a display device according to a first embodiment of the disclosure will be described below.

Figure 1:
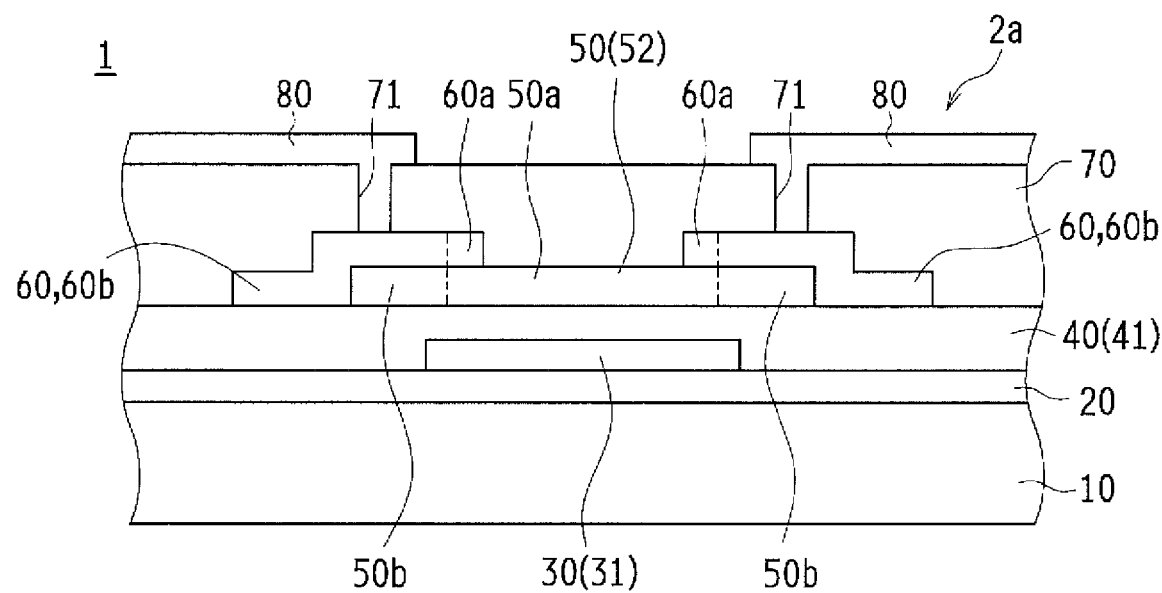
FIG. 1 is a schematic cross-sectional view schematically illustrating a first transistor of a display device according to a first embodiment of the disclosure.
Figure 2:
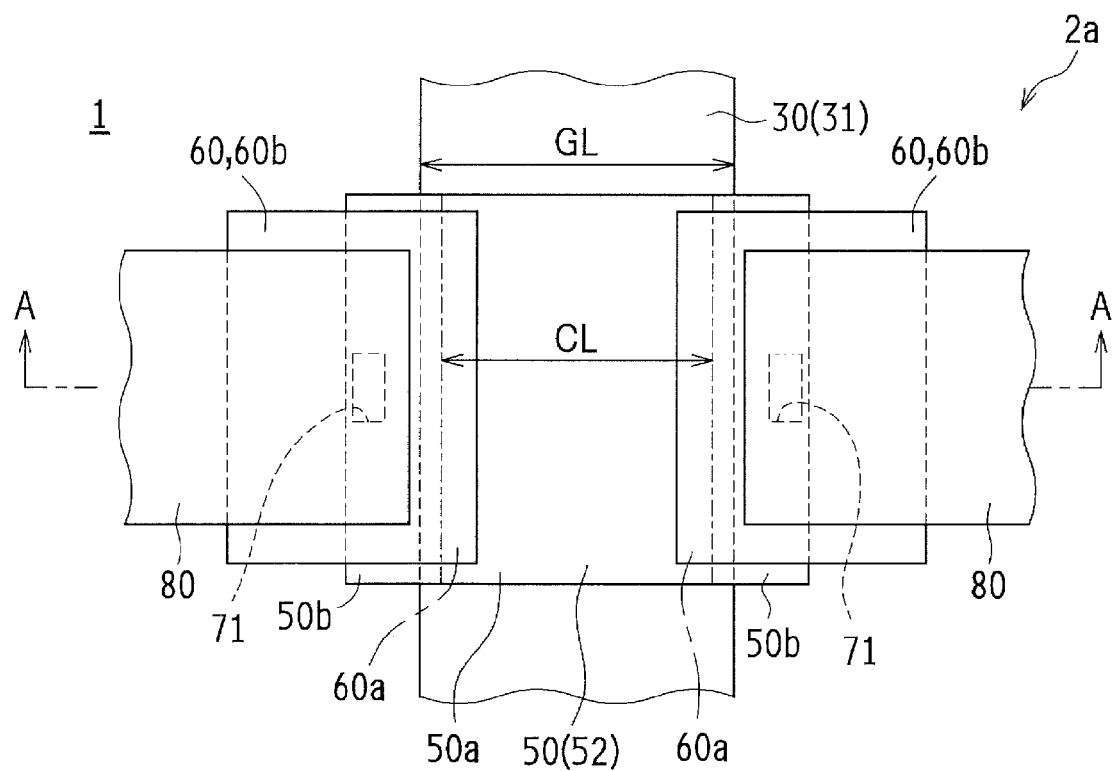
FIG. 2 is a schematic plan view of the first transistor illustrated in FIG. 1.

FIG. 1 is a schematic cross-sectional view schematically illustrating a first transistor of a display device according to the first embodiment of the disclosure, and FIG. 2 is a schematic plan view of the first transistor illustrated in FIG. 1. Note that, in view of the visibility of the drawings, hatching is omitted in FIG. 1, and an interlayer insulating film 70 and the like are perspectively illustrated in FIG. 2. In addition, FIG. 1 illustrates a cross-section taken along arrow marks A-A in FIG. 2.

A first transistor 2a (thin film transistor: TFT) of a display device 1 according to the first embodiment of the disclosure includes an inorganic film 20, a lower gate electrode 31 (gate electrode 30), a lower gate insulating layer 41 (gate insulating layer 40), a first metal oxide layer 50, second metal oxide layers 60, the interlayer insulating film 70, and terminal electrodes 80 are sequentially laminated on a substrate 10. Note that a manufacturing process of the first transistor 2a and the details of each portion will be described with reference to FIGS. 3A to 3D, which will be described later. Also, for purposes of explanation below, the lower gate electrode 31 and an upper gate electrode 32, which will be described later, may be referred to as the gate electrode 30, and the lower gate insulating layer 41 and the upper gate insulating layer 42, which will be described later, may be referred to as the gate insulating layer 40.

In FIG. 1, a single transistor (the first transistor 2a) formed on the substrate 10 is illustrated in an enlarged manner, and a plurality of transistors may be further formed on the substrate 10. The inorganic film 20 is formed in such a manner as to cover the entire substrate 10. Note that, for purposes of explanation below, a direction along a surface of the substrate 10, which is a left and right direction in FIG. 1, may be referred to as a channel length direction.

The lower gate electrode 31 is provided on the inorganic film 20 substantially in the center in the channel length direction of the first transistor 2a. As illustrated in FIG. 2, in plan view, the gate electrode 30 is extended to the outside of the first transistor 2a, and is, for example, a gate wiring line to be connected to another transistor or the like. Although FIG. 2 illustrates a configuration in which the gate electrode 30 extends in a straight line, the configuration is not limited thereto, and depending on the position of an object to be connected, an extending orientation may be changed as appropriate.

The lower gate insulating layer 41 is provided on the lower gate electrode 31, and covers a portion of the inorganic film 20 that does not overlap with the lower gate electrode 31. In other words, the lower gate insulating layer 41 is formed in such a manner as to cover the entire substrate 10.

The first metal oxide layer 50 is provided on the lower gate insulating layer 41 and is disposed for each transistor. That is, the first metal oxide layer 50 is provided in such a manner as to be separated from another first metal oxide layer 50 of another transistor. The first metal oxide layer 50 includes first conductor regions 50b positioned at both end portions in the channel length direction, and a first semiconductor region 50a positioned in the center in the channel length direction. The first conductor region 50b is a region where an oxide semiconductor is made electrically conductive, and the first semiconductor region 50a is a region where the oxide semiconductor is not made electrically conductive. In addition, in the channel length direction, an overall length of the first metal oxide layer 50 is longer than that of the lower gate electrode 31, and a length of the first semiconductor region 50a is shorter than that of the lower gate electrode 31.

As described above, in a transistor (the first transistor 2a), a semiconductor region (the first semiconductor region 50a) is sandwiched between conductor regions at two positions (the first conductor regions 50b) in the channel length direction, and one of the conductor regions at the two positions corresponds to a source region and the other corresponds to a drain region. Moreover, the first semiconductor region 50a provided between the source region and the drain region overlaps with the lower gate electrode 31, and corresponds to a channel region.

The second metal oxide layers 60 are provided on the first metal oxide layer 50, and are disposed at two divided positions for each transistor. Specifically, the second metal oxide layers 60 are at two positions separated from each other in the channel length direction, and overlap with both end portions of the first metal oxide layer 50, and a part of each of the second metal oxide layers 60 extends outward from the first metal oxide layer 50. The second metal oxide layer 60 includes a second conductor region 60b where the oxide semiconductor is made electrically conductive, and a second semiconductor region 60a where the oxide semiconductor is not made electrically conductive. The second conductor region 60b is provided in a portion overlapping with the first conductor region 50b, and the second semiconductor region 60a is provided in a portion overlapping with the first semiconductor region 50a. A position of a boundary between the second conductor region 60b and the second semiconductor region 60a matches a position of a boundary between the first conductor region 50b and the first semiconductor region 50a in the channel length direction, and in FIG. 1 and FIG. 2, the boundaries described above are indicated by a dashed-dotted line.

As illustrated in FIG. 1, the first metal oxide layer 50 is directly in contact with the second metal oxide layers 60 in all regions overlapping with the second metal oxide layers 60, and an insulating film or the like is not interposed between the first metal oxide layer 50 and each of the second metal oxide layers 60. Furthermore, the first metal oxide layer 50 (a crystalline first film 52) has crystallinity, and the second metal oxide layer 60 has non-crystallinity.

Note that in the present embodiment, a conductor region indicates a region made electrically conductive of the metal oxide layer (the first metal oxide layer 50 and the second metal oxide layer 60), and a semiconductor region indicates a region that is not made electrically conductive but in a state of a semiconductor of the metal oxide layer (the first metal oxide layer 50 and the second metal oxide layer 60). Additionally, a channel region is a semiconductor region, which overlaps with the gate electrode 30, and indicates a region where ON/OFF characteristics change depending on a potential of the gate electrode 30.

Additionally, as illustrated in FIG. 2, in the channel length direction, a width of the lower gate electrode 31 (gate electrode width GL) is larger than a width of the first semiconductor region 50a and a width between the second semiconductor regions 60a (semiconductor region width CL).

The interlayer insulating film 70 is formed in such a manner as to cover the lower gate insulating layer 41, the first metal oxide layer 50, and the second metal oxide layer 60. The terminal electrodes 80 are provided on the interlayer insulating film 70 at two positions separated from each other in the channel length direction. One of the terminal electrodes 80 corresponds to a source electrode, and is electrically connected to one second conductor region 60b (at the left side in FIG. 1) of the second metal oxide layers 60 through a contact hole 71 provided in the interlayer insulating film 70. The other of the terminal electrodes 80 corresponds to a drain electrode, and is electrically connected to the other second conductor region 60b (at the right side in FIG. 1) of the second metal oxide layers 60 through the contact hole 71 provided in the interlayer insulating film 70. The terminal electrode 80 is extended to the outside of the first transistor 2a, and may be, for example, a wiring line to be connected to another transistor or the like.

Next, a manufacturing process of the first transistor will be described in detail with reference to FIGS. 3A to 3D.

Figure 3A:
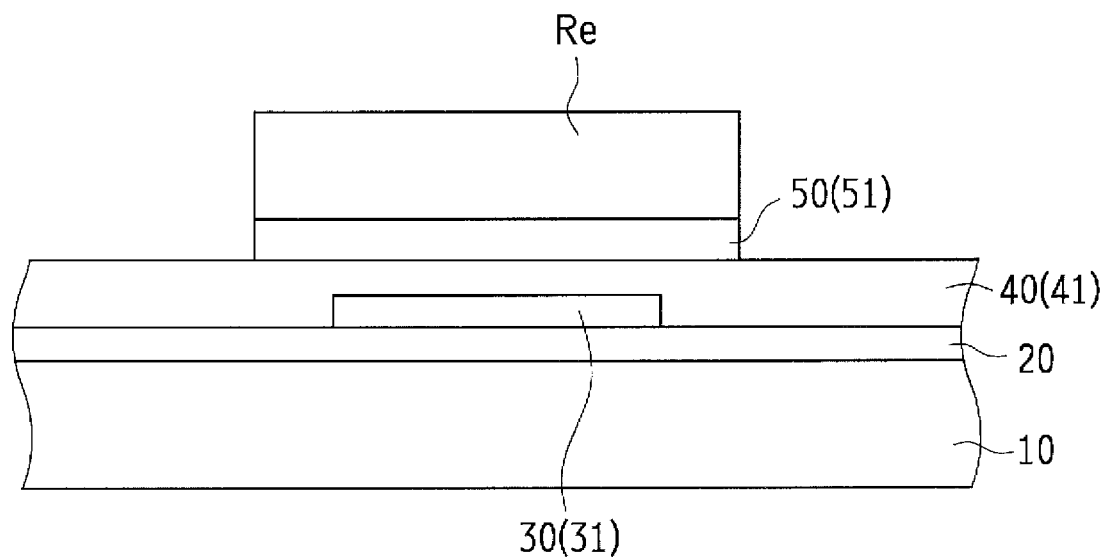
FIG. 3A is a schematic cross-sectional view illustrating the first transistor subjected to first film etching.

FIG. 3A is a schematic cross-sectional view illustrating the first transistor subjected to first film etching.

In the manufacturing process of the first transistor, the inorganic film 20 that is an insulating film is formed on the substrate 10 before forming the first metal oxide layer 50. As the substrate 10, for example, a glass substrate, a silicon substrate, a plastic substrate (resin substrate) having thermal resistance can be used. As a material of the plastic substrate (resin substrate), polyethylene terephthalate (PET), polyethylene naphthalate (PEN), polyethersulfone (PES), acrylic resin, polyimide, or the like can be used. The inorganic film 20 may be formed by CVD, for example, and may be formed of a single compound, or a plurality of layers may be laminated.

Next, in lower gate forming, the lower gate electrode 31 and the lower gate insulating layer 41 are formed on the inorganic film 20. Specifically, a metal film serving as a base of the lower gate electrode 31 is formed by using a sputtering method, and the lower gate electrode 31 is formed by patterning the metal film by using a photolithography process. For the metal film serving as the base of the lower gate electrode 31, for example, a metal film containing an element selected from aluminum (Al), molybdenum (Mo), tantalum (Ta), chromium (Cr), titanium (Ti), and gold (Au), an alloy film containing these elements as components or the like may be used, or a laminated film including a plurality of films among these films may be used, and a thickness thereof is set to from 100 to 300 nm.

The lower gate insulating layer 41 is a silicon oxide film ($SiO_2$) or a silicon nitride film (SiNx) having a thickness of from 300 to 400 nm, and is formed at from 300 to 400° C. by using a plasma CVD apparatus. Note that the lower gate insulating layer 41 may have a laminated structure of a silicon oxide film and a silicon nitride film.

After the film formation of the lower gate insulating layer 41, a thin film of an oxide semiconductor having non-crystallinity (for example, In—W—Sn—O, In—Sn—Zn—O) and serving as a base of the first metal oxide layer 50 is formed in first film forming. The oxide semiconductor film described above is formed at from 200 to 400° C. by using a sputtering device, and has a thickness of from 40 to 50 nm. After the film formation, inert argon gas (for example, the flow rate: from 100 to 300 sccm) and oxygen gas (for example, the flow rate: from 5 to 20 sccm) may be introduced into the sputtering device. In an oxide semiconductor, it is preferable that a content rate of In be equal to or larger than 80 at %.

After the formation of the oxide semiconductor film, in first film etching, the oxide semiconductor film is patterned to be formed into an oxide semiconductor layer (non-crystalline first film 51) serving as an active layer of the transistor and having island shapes. Specifically, a resist mask Re patterned by the photolithography process is formed on the oxide semiconductor film, and patterning is performed by wet etching. The resist mask Re is provided in a portion overlapping with the first metal oxide layer 50 illustrated in FIG. 1. A wet etching solution (etchant) is a mixture of phosphoric acid, nitric acid, and acetic acid. By the wet etching, the oxide semiconductor film is formed into the non-crystalline first film 51 having a shape corresponding to the resist mask Re.

Figure 3B:
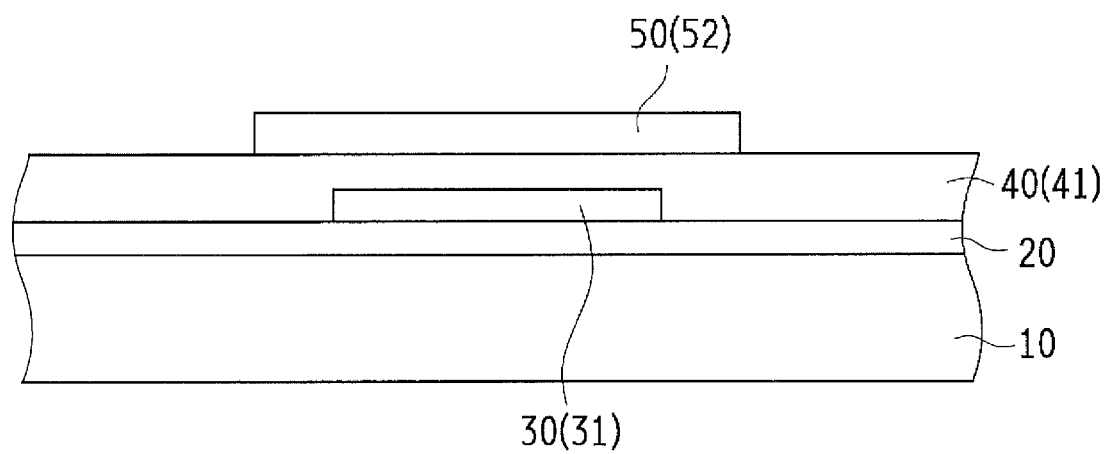
FIG. 3B is a schematic cross-sectional view illustrating the first transistor subjected to crystallizing.

FIG. 3B is a schematic cross-sectional view illustrating the first transistor subjected to crystallizing.

After the wet etching is completed, the resist mask Re is removed. Next, in the crystallizing, an annealing process is performed on the non-crystalline first film 51. It is desirable that conditions in the annealing process exceed 400° C. and one hour, for example. By the annealing process, the non-crystalline first film 51 is changed to a crystalline first film 52 having crystallinity. In other words, the oxide semiconductor film is not crystallized by simply performing the film formation by using the sputtering device, and the oxide semiconductor film is crystallized by the annealing process.

Figure 3C:
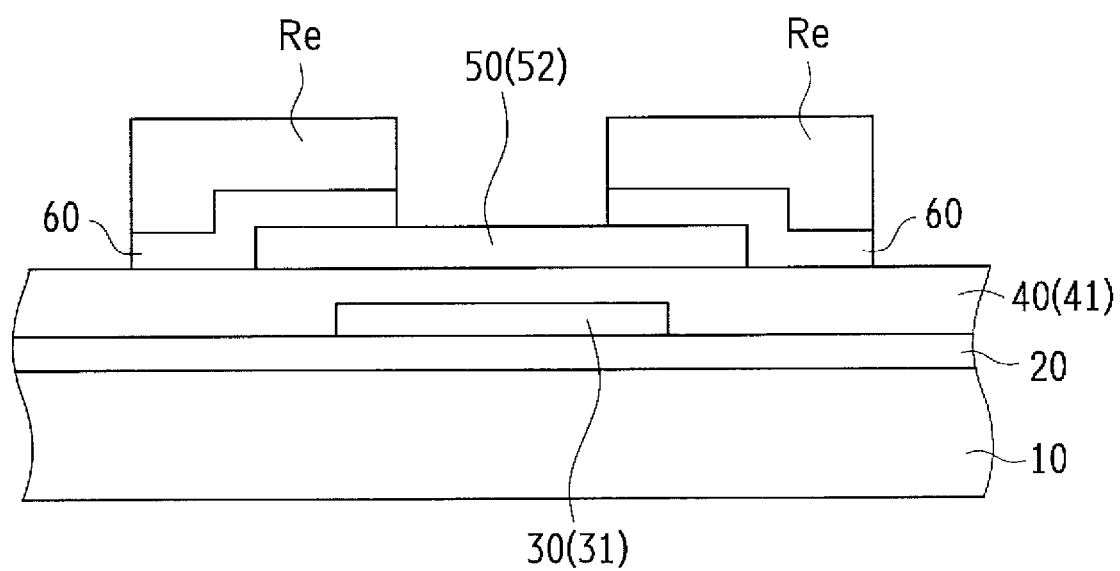
FIG. 3C is a schematic cross-sectional view illustrating the first transistor subjected to second film etching.

FIG. 3C is a schematic cross-sectional view illustrating the first transistor subjected to second film etching.

Oxide semiconductors having non-crystallinity and serving as bases of the second metal oxide layers 60 are film-formed on the crystalline first film 52 in second film forming. The second film forming is performed in a similar manner to the first film forming. In other words, the oxide semiconductor films (non-crystalline second films) serving as the bases of the second metal oxide layers 60 are formed of an identical material by an identical method and have an identical thickness, with respect to the oxide semiconductor film serving as the base of the first metal oxide layer 50.

After the non-crystalline second films are formed, in the second film etching, the non-crystalline second films are patterned to be formed into the oxide semiconductor layers (the second metal oxide layers 60) serving as the source/drain regions. In other words, similarly to the first film etching, resist masks Re patterned by the photolithography process are formed, and patterning is performed by the wet etching. The resist masks Re here are provided in portions overlapping with the second metal oxide layers 60 illustrated in FIG. 1. A wet etching solution is a mixture of phosphoric acid, nitric acid, and acetic acid similar to that of the first film etching. By the wet etching, the non-crystalline second films are formed into the second metal oxide layers 60 having shapes corresponding to the resist masks Re.

The first metal oxide layer 50 is provided as the lower layer of the second metal oxide layers 60, and in the second film etching, the first metal oxide layer 50 is also exposed to the wet etching solution. However, the first metal oxide layer 50 is the crystallized crystalline first film 52, and etching resistance thereof is improved. Thus, etching of the second metal oxide layers 60 can be completed before affecting the first metal oxide layer 50 because a sufficient selection ratio can be obtained due to a difference in crystallinity between the first metal oxide layer 50 and the second metal oxide layers 60.

In the present embodiment, the first metal oxide layer 50 and the second metal oxide layers 60 are formed of the identical material, and by using the identical material, it is possible to provide a clear difference in etching resistance due to crystallization while simplifying the manufacturing process and the like. Furthermore, the crystallization can be easily performed by using an oxide semiconductor containing tungsten or tin as the material.

Figure 3D:
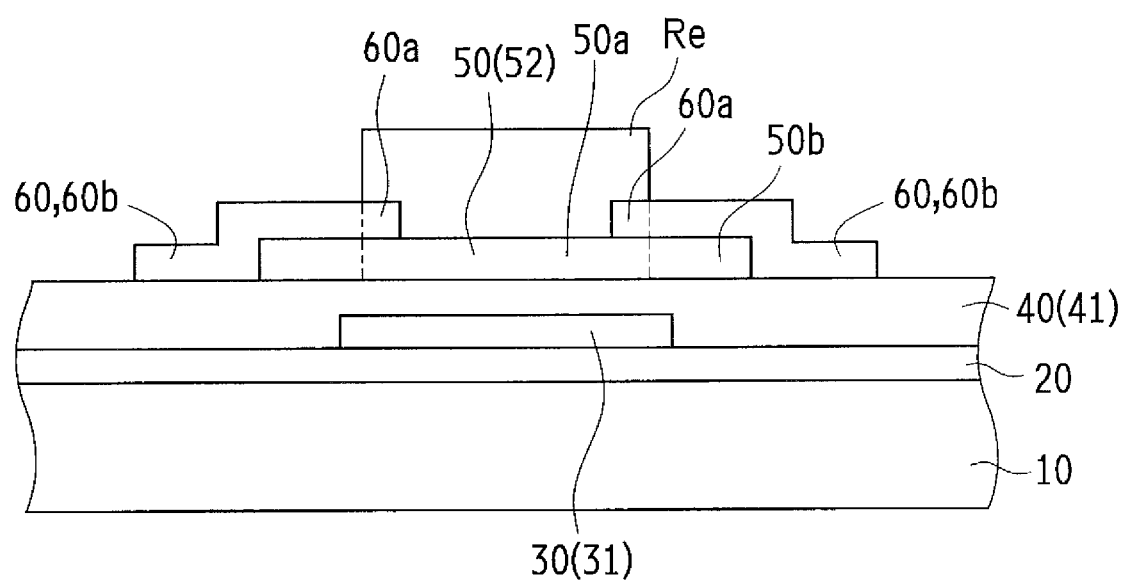
FIG. 3D is a schematic cross-sectional view illustrating the first transistor subjected to conductor forming.

FIG. 3D is a schematic cross-sectional view illustrating the first transistor subjected to conductor forming.

The resist masks Re formed in the second film etching are removed. Thereafter, a resist mask Re corresponding to the conductor forming is formed by the photolithography process. The resist mask Re here is provided in a portion overlapping with the first semiconductor region 50*a* and the second semiconductor region 60*a* illustrated in FIG. 1. In other words, portions directly above the first conductor regions 50*b* and the second conductor regions 60*b* are not covered by the resist mask Re. In the conductor forming, the source/drain regions are made to have a lower resistance (made electrically conductive) by $H_2$ plasma treatment. As a result, the first conductor regions 50*b* and the second conductor regions 60*b* that are not covered by the resist mask Re are made electrically conductive.

As described above, since the first metal oxide layer 50 and the second metal oxide layers 60 are made electrically conductive by using the identical resist mask Re, an edge (boundary) between the second conductor region 60*b* and the second semiconductor region 60*a* matches an edge (boundary) between the first conductor region 50*b* and the first semiconductor region 50*a* of the first metal oxide layer. Thus, since the second semiconductor region 60*a* is provided in an area that overlaps with the first semiconductor region 50*a*, the conductor forming of the first metal oxide layer 50 and the second metal oxide layers 60 can be performed together, and the manufacturing process can be simplified. Note that the matching here does not mean exactly matching, but includes a dimensional deviation of about several μm caused by a difference in etching rate or the like.

After the conductor forming is completed, the resist mask Re is removed, and the interlayer insulating film 70 covering the first metal oxide layer 50, the second metal oxide layers 60, and the lower gate insulating layer 41 is formed. The interlayer insulating film 70 is a silicon oxide film or a silicon nitride film having a thickness of from 200 to 300 nm, and is formed at 200 to 300° C. by using the plasma CVD apparatus. Note that the interlayer insulating film 70 may have a laminated structure of a silicon oxide film and a silicon nitride film.

The contact holes 71 each of which exposes a part of the second metal oxide layer 60 are formed in the interlayer insulating film 70 by a known photolithography process. As illustrated in FIG. 1, the contact hole 71 corresponding to the source region is provided at a position overlapping with one of the second conductor regions 60*b* (the left side in FIG. 1), and the contact hole 71 corresponding to the drain region is provided at a position overlapping with the other second conductor region 60*b* (the right side in FIG. 1).

After the interlayer insulating film 70 is formed, a conductive film for electrode that serves as a base of the terminal electrodes 80 is formed on the interlayer insulating film 70 and inside the contact holes 71. For the conductive film for electrode, a material exemplified as that of the lower gate electrode 31 can be used.

The first transistor 2*a* illustrated in FIG. 1 is formed by patterning the conductive film for electrode. In other words, by the patterning, the conductive film for electrode is shaped in such a manner as to be separated into the two terminal electrodes 80 (the source electrode and the drain electrode).

After the interlayer insulating film 70 is formed, heat treatment at from 200 to 400° C. in dry air or atmospheric air may be performed for from 1 to 2 hours. The element characteristics of the TFT can be improved by the heat treatment.

The upper face of the interlayer insulating film 70 illustrated in FIG. 1 is illustrated in a flat shape in consideration of the visibility of the drawing, but is not limited thereto, and may have a uniform thickness, and the concavities and convexities in the lower layer may be reflected on the upper face. Additionally, in a case where a configuration is employed in which the terminal electrodes 80 are not provided, the contact holes 71 need not be provided.

Note that although not illustrated in the drawings, a flattening film may be provided to cover the upper face of the transistor (on the side on which the terminal electrodes 80 are formed), or a pixel electrode or the like may be provided on the flattening film. Furthermore, a display element such as an OLED, a QLED, an LCD and the like, which will be described later, may be provided on the upper portion of the transistor.

As described above, in the transistor, the first metal oxide layer 50 having crystallinity and the second metal oxide layer 60 having non-crystallinity are laminated in order, and a conductor region is provided in at least one of the first metal oxide layer 50 and the second metal oxide layer. In this manner, a selection ratio in etching can be obtained by overlapping metal oxides each other having different crystallinity from each other and making a difference in etching resistance. Utilizing this characteristic can mitigate limitations in materials, a manufacturing process, and the like, and can increase the degree of freedom in designing transistors.

The metal-based oxide semiconductors used as the material of the first metal oxide layer 50 and the second metal oxide layers 60 are not limited to those described above, and other materials may be used. In addition to those described above, the oxide semiconductor may be, for example, an In—Al—Sn—Zn—O-based semiconductor, an In—Ga—Sn—O-based semiconductor, and an In—Ga—Zn—Sn—O-based semiconductor.

Second Embodiment

Next, with reference to drawings, a display device according to a second embodiment of the disclosure will be described. Note that, in the second embodiment, constituent elements having substantially identical functions to those of the first embodiment will be denoted by the identical reference signs, and descriptions thereof will be omitted.

Figure 4:
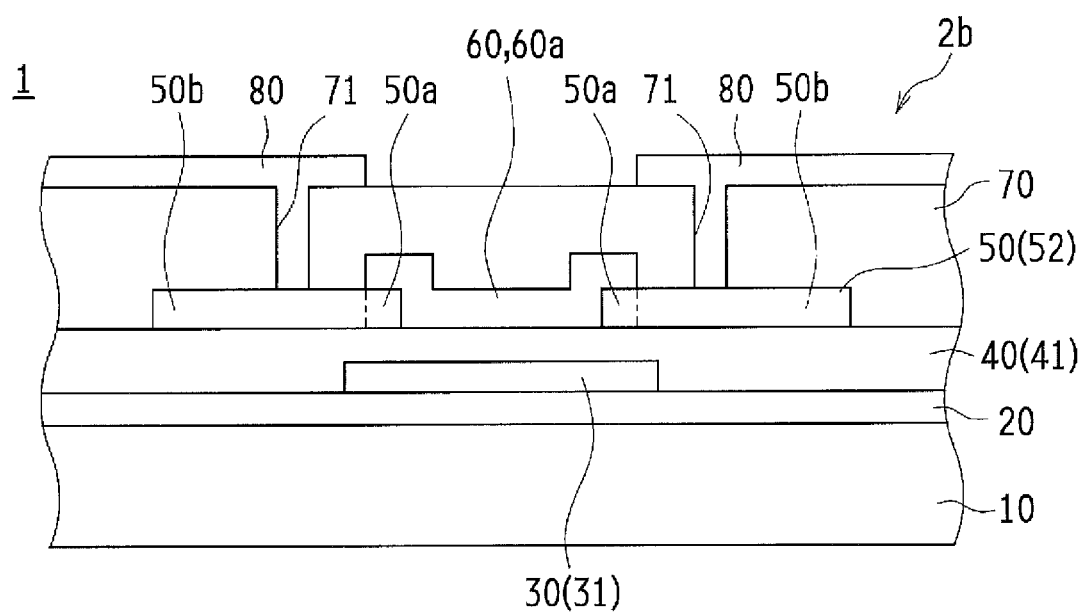
FIG. 4 is a schematic cross-sectional view schematically illustrating a second transistor of a display device according to a second embodiment of the disclosure.
Figure 5:
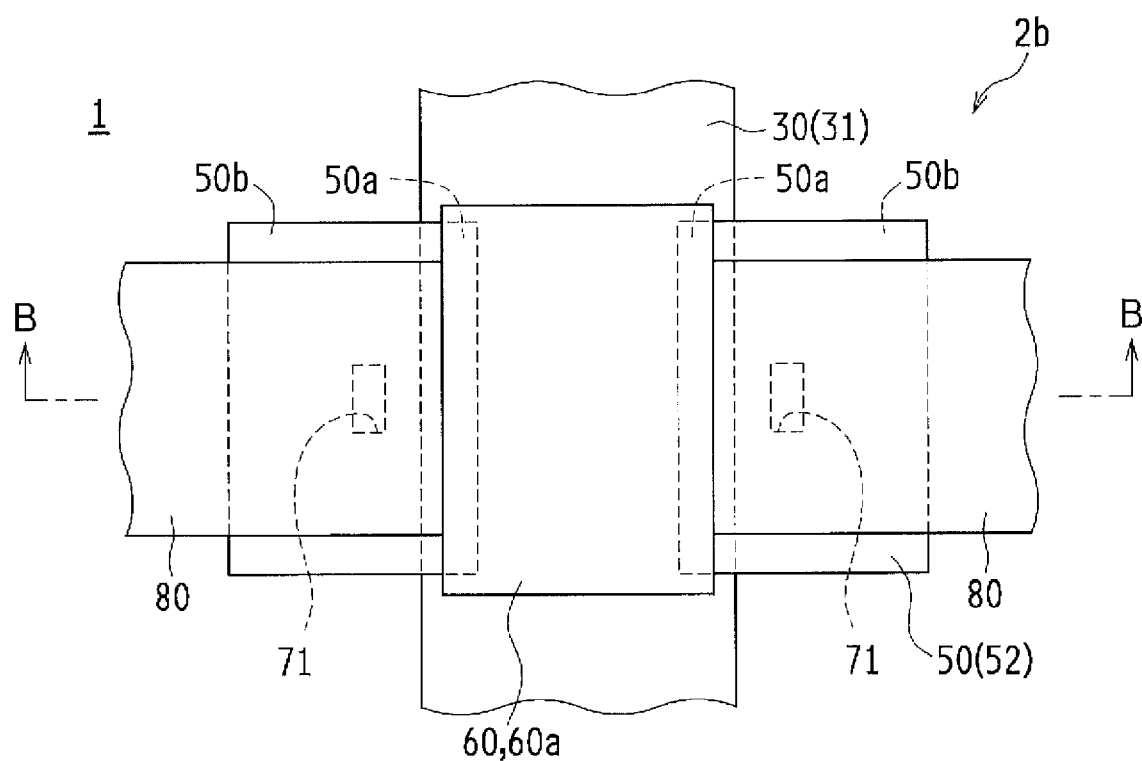
FIG. 5 is a schematic plan view of the second transistor illustrated in FIG. 4.

FIG. 4 is a schematic cross-sectional view schematically illustrating a second transistor of the display device according to the second embodiment of the disclosure, and FIG. 5 is a schematic plan view of the second transistor illustrated in FIG. 4. Note that, in view of the visibility of the drawings, hatching is omitted in FIG. 4, and the interlayer insulating film 70 and the like are perspectively illustrated in FIG. 5. In addition, FIG. 4 illustrates a cross-section taken along arrow marks B-B in FIG. 5.

In the second embodiment, the first metal oxide layers 50 and the second metal oxide layer 60 are provided in different areas from the first embodiment. Specifically, in a second transistor 2*b*, the first metal oxide layers 50 are provided on the lower gate insulating layer 41, and are disposed at two divided positions for each transistor in such a manner as to be separated from each other in a channel length direction. The second metal oxide layer 60 is provided in such a manner as to straddle the first metal oxide layers 50 at the two positions separated from each other, and both end portions thereof in the channel length direction overlap end portions of the first metal oxide layers 50.

In other words, in the first embodiment, the first metal oxide layer 50 provided in the center in the channel length direction is disposed in such a manner as to be sandwiched between the second metal oxide layers 60 divided into the two positions, while in the second embodiment, the second metal oxide layer 60 is provided in the center in the channel length direction and is sandwiched between the first metal oxide layers 50 divided into two positions.

In one first metal oxide layer 50, the first semiconductor region 50a is provided at the end portion on a side facing the other first metal oxide layer 50, and the first conductor region 50b is provided in a portion extending outward from the second metal oxide layer 60 in the channel length direction. The entirety of the second metal oxide layer 60 is the second semiconductor region 60a. A position of a boundary between the first conductor region 50b and the first semiconductor region 50a matches a position in the channel length direction of the edge of the second metal oxide layer 60 (second semiconductor region 60a), and in FIG. 4, the boundary described above is indicated by a dashed-dotted line.

The second metal oxide layer 60 is formed shorter in length in the channel length direction than the lower gate electrode 31, and the entire second metal oxide layer 60 overlaps with the lower gate electrode 31. Additionally, in the first metal oxide layer 50, the first semiconductor region 50a overlaps with the lower gate electrode 31.

In addition, in the first embodiment, the second metal oxide layer 60 and the terminal electrode 80 are connected, but in the second embodiment, the first metal oxide layer 50 and the terminal electrode 80 are connected. Specifically, one of the terminal electrodes 80 corresponds to the source electrode, and is electrically connected to one of the first conductor regions 50b (the left side in FIG. 4) of the first metal oxide layer 50 through the contact hole 71 provided in the interlayer insulating film 70. The other of the terminal electrodes 80 corresponds to the drain electrode, and is electrically connected to the other first conductor region 50b (the right side in FIG. 4) of the first metal oxide layer 50 through the contact hole 71 provided in the interlayer insulating film 70.

Next, a manufacturing process of the second transistor will be described in detail with reference to FIGS. 6A to 6C.

Figure 6A:
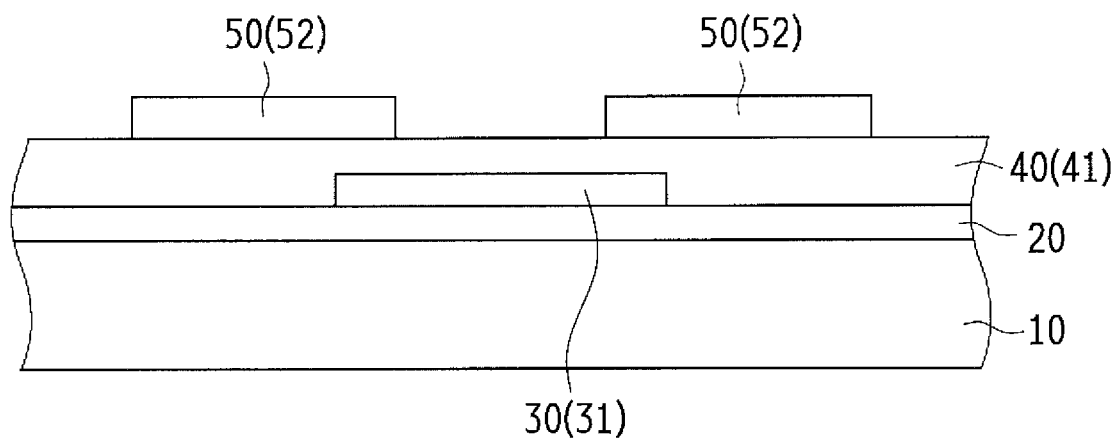
FIG. 6A is a schematic cross-sectional view illustrating the second transistor subjected to crystallizing.

FIG. 6A is a schematic cross-sectional view illustrating the second transistor subjected to crystallizing.

Since the second transistor 2b is manufactured in the substantially identical process to that of the first transistor 2a, only different portions will be described in detail, and description of common portions will be omitted. Specifically, the inorganic film 20, the lower gate electrode 31, the lower gate insulating layer 41, and the oxide semiconductor film serving as the base of the first metal oxide layer 50 are laminated on the substrate 10 by a process common to the manufacturing method of the first transistor 2a until the first film forming.

A detailed drawing of the first film etching in the second embodiment is omitted, but as illustrated in FIG. 6A, a shape of the non-crystalline first film 51 after the patterning by the photolithography process differs from that of the non-crystalline first film 51 in the first transistor 2a. In other words, the non-crystalline first film 51 in the second transistor 2b has a shape in which the first semiconductor region 50a and the first conductor region 50b illustrated in FIG. 4 are combined, and is provided in such a manner as to be divided into two positions for each transistor.

In the crystallizing, the annealing process is performed under the identical conditions to those in a case of the first transistor 2a, and the crystalline first film 52 is obtained.

Figure 6B:
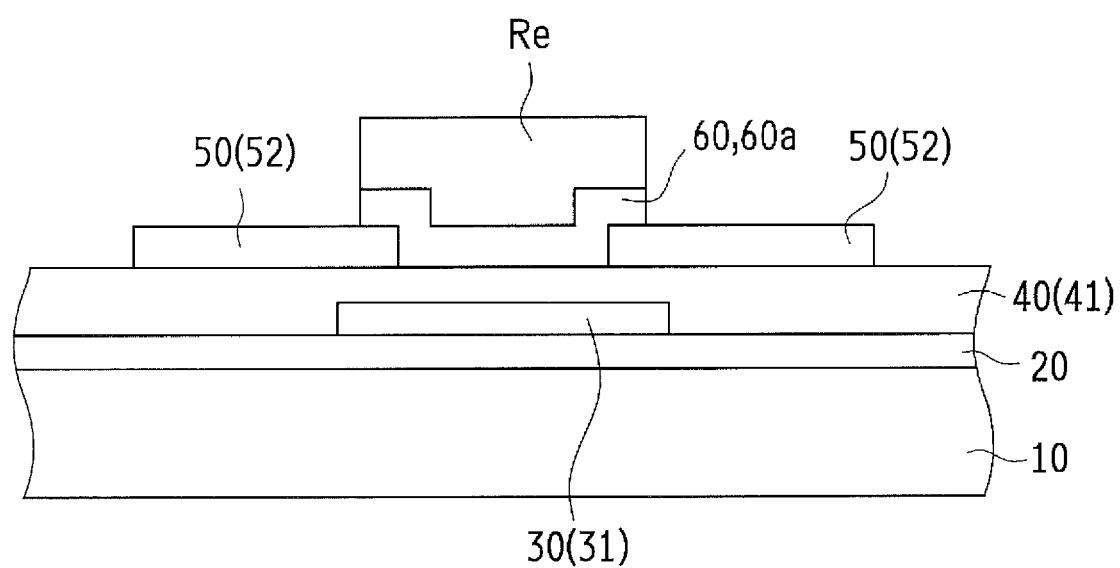
FIG. 6B is a schematic cross-sectional view illustrating the second transistor subjected to second film etching.

FIG. 6B is a schematic cross-sectional view illustrating the second transistor subjected to second film etching.

In the second embodiment, the second film forming similar to that in the first embodiment is performed, but a shape of the resist mask Re formed in the second film etching is different. As illustrated in FIG. 6B, the resist mask Re is provided in a portion overlapping with the second metal oxide layer 60 illustrated in FIG. 4. In the second embodiment, wet etching is performed in a similar manner to that in the first embodiment, and even when the second metal oxide layer 60 is etched, the first metal oxide layers 50 are not greatly affected.

Figure 6C:
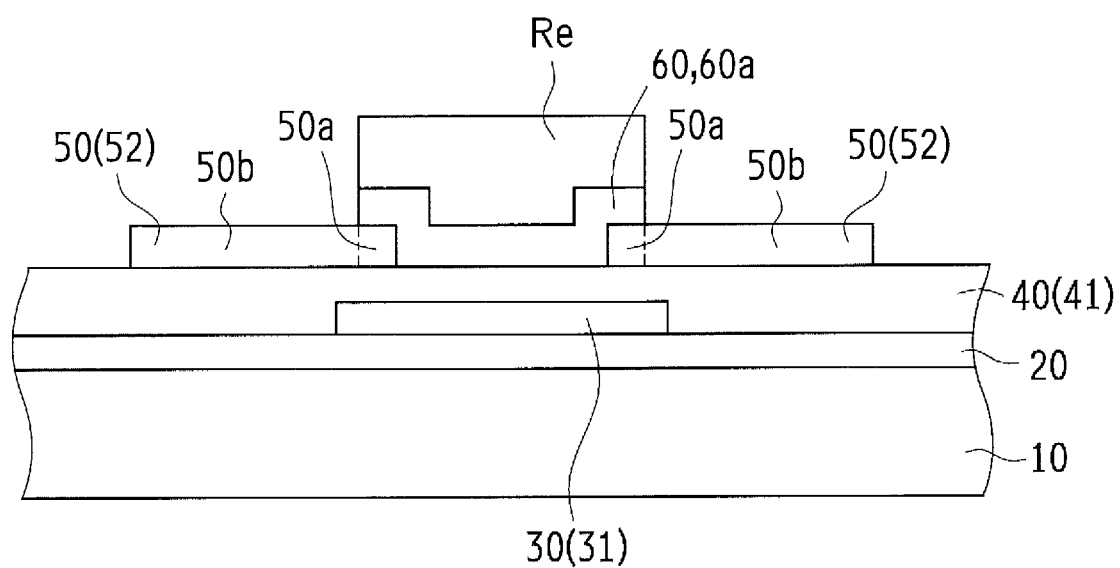
FIG. 6C is a schematic cross-sectional view illustrating the second transistor subjected to conductor forming.

FIG. 6C is a schematic cross-sectional view illustrating the second transistor subjected to conductor forming.

In the second embodiment, the conductor forming may be performed by using the resist mask Re formed in the second film etching. That is, since the entire second metal oxide layer 60 is the second semiconductor region 60a in the second transistor 2b, the second metal oxide layer 60 need not be made electrically conductive. Furthermore, in the first metal oxide layer 50, a portion that is not covered by the second metal oxide layer 60 is the first conductor region 50b, so the portion exposed by the wet etching in the second film etching is made electrically conductive. As described above, in the second embodiment, the second film etching and the conductor forming can be continuously performed, and there is no need to perform the photolithography process between them.

After the conductor forming is completed, the interlayer insulating film 70 and the terminal electrodes 80 may be formed in a substantially similar manner to that in the first embodiment, and portions where the contact holes 71 are provided and connected may be appropriately adjusted.

As described above, the first transistor 2a and the second transistor 2b can be manufactured in a substantially similar manner, and by making the shapes of the resist mask Re in the photolithography process different, both of the first transistor 2a and the second transistor 2b can be formed on the identical substrate 10 at the same time. The display device 1 may have a configuration in which a plurality of transistors is provided, and the first transistor 2a and the second transistor 2b may be provided together. By providing a plurality of transistors having different structures on the identical substrate 10, the display device 1 having transistors having different characteristics can be used. The display device 1 having transistors having different characteristics will be described in detail with reference to FIG. 17, which will be described later.

Third Embodiment

Next, with reference to the drawings, a display device according to a third embodiment of the disclosure will be described. Note that, in the third embodiment, constituent elements having functions substantially equivalent to those of the first embodiment and the second embodiment are denoted by the same reference signs, and descriptions thereof will be omitted.

Figure 7:
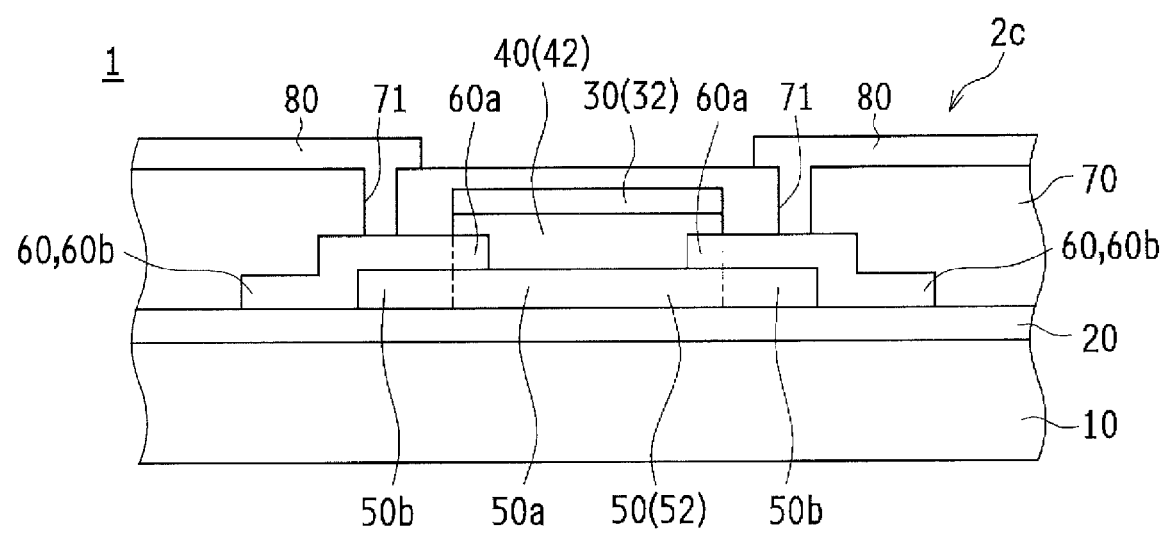
FIG. 7 is a schematic cross-sectional view schematically illustrating a third transistor of a display device according to a third embodiment of the disclosure.
Figure 8:
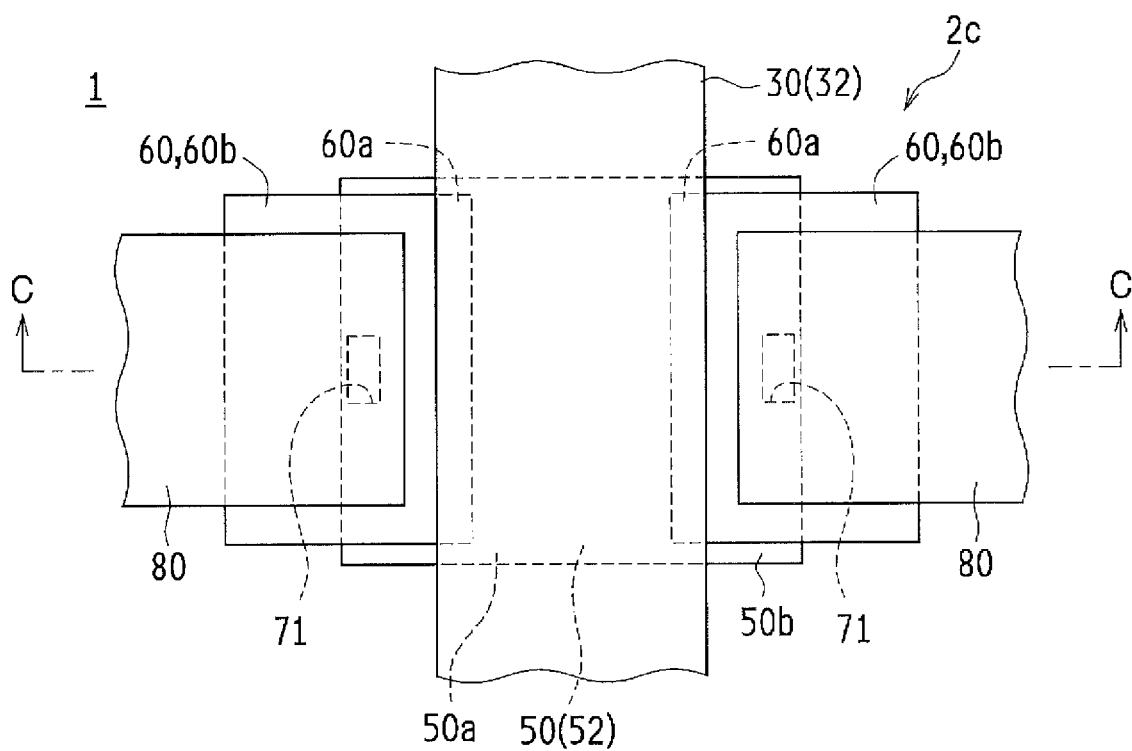
FIG. 8 is a schematic plan view of the third transistor illustrated in FIG. 7.

FIG. 7 is a schematic cross-sectional view schematically illustrating a third transistor of the display device according to the third embodiment of the disclosure, and FIG. 8 is a schematic plan view of the third transistor illustrated in FIG. 7. Note that, in view of the visibility of the drawings, hatching is omitted in FIG. 7, and the interlayer insulating film 70 and the like are perspectively illustrated in FIG. 8. FIG. 7 illustrates a cross-section taken along arrow marks C-C in FIG. 8.

In the third embodiment, the order in which the gate electrode 30 and the gate insulating layer 40 are laminated is different from that in the first embodiment. Specifically, in a third transistor 2c, the first metal oxide layer 50 is directly laminated on the inorganic film 20 without interposing the lower gate electrode 31 and the lower gate insulating layer 41. Only the fact that first metal oxide layer 50 and the second metal oxide layers 60 are laminated on the inorganic film 20 differs from the case of the first embodiment, and each position thereof is identical to that in the first embodiment. In other words, the first metal oxide layer 50 is positioned substantially in the center of the third transistor 2c in a channel length direction, and the second metal oxide layers 60 are divided and disposed at two positions in such a manner as to overlap with both end portions of the first metal oxide layer 50.

Furthermore, in the third embodiment, a positional relationship between a conductor region and a semiconductor region is substantially similar to that of the first embodiment. The first metal oxide layer 50 includes the first conductor regions 50b positioned at both end portions in the channel length direction, and the first semiconductor region 50a positioned in the center in the channel length direction. The second metal oxide layer 60 includes the second conductor region 60b provided in such a manner as to overlap with the first conductor region 50b, and the second semiconductor region 60a provided in such a manner as to overlap the first semiconductor region 50a.

A position of a boundary between the first conductor region 50b and the first semiconductor region 50a matches a position of a boundary between the second conductor region 60b and the second semiconductor region 60a in the channel length direction, and in FIG. 7, the boundaries described above are indicated by a dashed-dotted line.

In the third embodiment, the gate electrode 30 and the gate insulating layer 40 are laminated on the first metal oxide layer 50 and the second metal oxide layers 60. Specifically, the upper gate insulating layer 42 is provided on the first metal oxide layer 50 and the second metal oxide layers 60 in a portion overlapping with the first semiconductor region 50a and the second semiconductor regions 60a. The upper gate electrode 32 is provided on the upper gate insulating layer 42 and overlaps with the upper gate insulating layer 42.

The interlayer insulating film 70 is provided in such a manner as to cover the inorganic film 20, the second metal oxide layers 60, and the upper gate electrode 32, and the terminal electrodes 80 are provided on the interlayer insulating film 70. The terminal electrode 80 is connected to the second conductor region 60b of the second metal oxide layer 60 through the contact hole 71 provided in the interlayer insulating film 70.

Next, a manufacturing process of the third transistor will be described in detail with reference to FIGS. 9A to 9E.

Figure 9A:
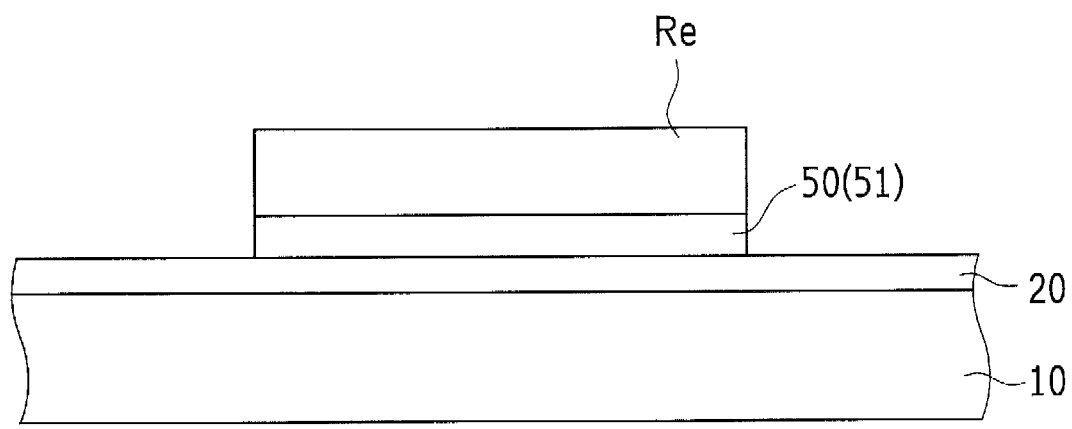
FIG. 9A is a schematic cross-sectional view illustrating the third transistor subjected to first film etching.

FIG. 9A is a schematic cross-sectional view illustrating the third transistor subjected to first film etching.

In the third transistor 2c, the inorganic film 20 is formed on the substrate 10 in a similar manner to the first transistor 2a, and then the first film forming and the first film etching are performed without performing the lower gate forming. A structure illustrated in FIG. 9A differs from the structure illustrated in FIG. 3A only in that the structure illustrated in FIG. 9A does not include the lower gate electrode 31 and the lower gate insulating layer 41, but shapes of the non-crystalline first film 51 and the resist mask Re are identical to those in the structure in FIG. 3A.

Figure 9B:
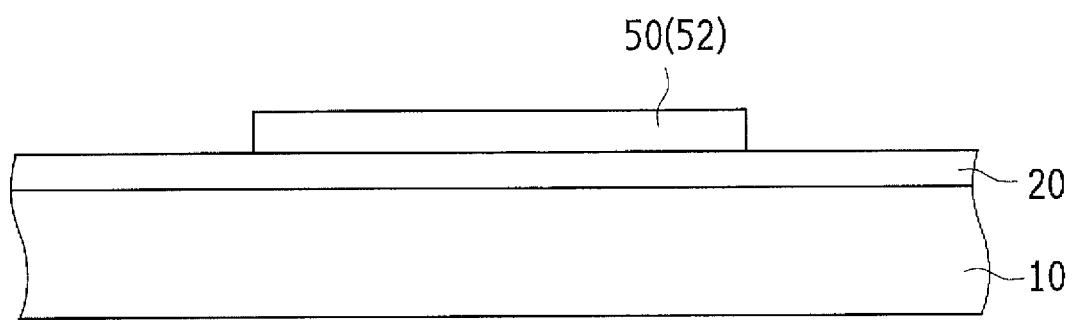
FIG. 9B is a schematic cross-sectional view illustrating the third transistor subjected to crystallizing.

FIG. 9B is a schematic cross-sectional view illustrating the third transistor subjected to crystallizing.

In the third transistor 2c, similarly to the first transistor 2a, after the resist mask Re is removed, the non-crystalline first film 51 is crystallized by performing the annealing process. In other words, the structure illustrated in FIG. 9B differs from the structure illustrated in FIG. 3B only in that the structure illustrated in FIG. 9B does not include the lower gate electrode 31 and the lower gate insulating layer 41.

Figure 9C:
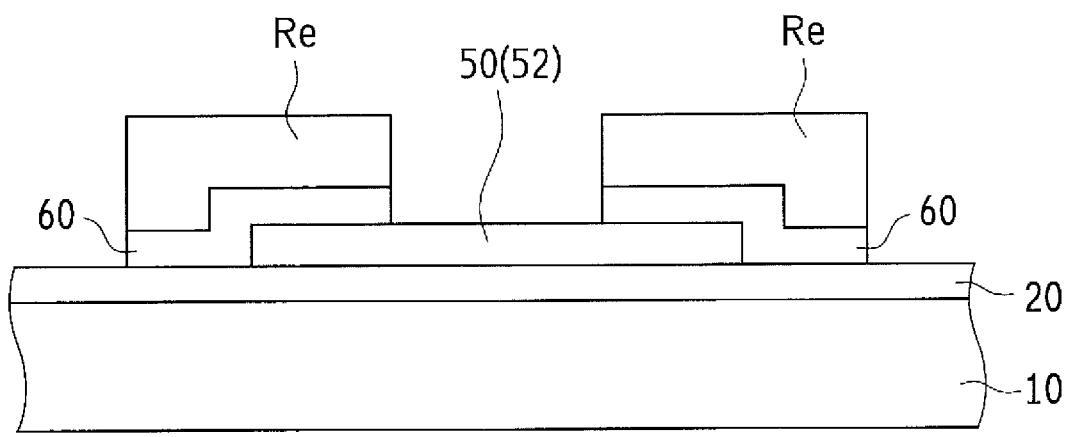
FIG. 9C is a schematic cross-sectional view illustrating the third transistor subjected to second film etching.

FIG. 9C is a schematic cross-sectional view illustrating the third transistor subjected to second film etching.

In the third transistor 2c, similarly to the first transistor 2a, the second film forming and the second film etching are performed. In other words, the structure illustrated in FIG. 9C differs from the structure illustrated in FIG. 3C only in that the structure illustrated in FIG. 9C does not include the lower gate electrode 31 and the lower gate insulating layer 41.

Figure 9D:
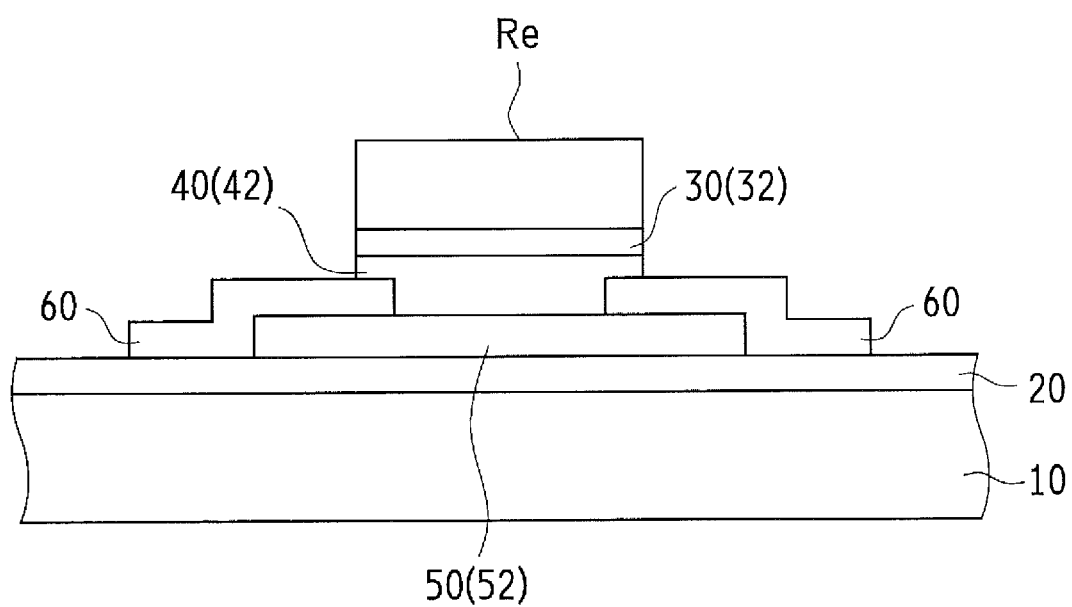
FIG. 9D is a schematic cross-sectional view illustrating the third transistor subjected to upper gate forming.

FIG. 9D is a schematic cross-sectional view illustrating the third transistor subjected to upper gate forming.

After the second film etching is completed, the resist masks Re are removed. Next, in the upper gate forming, a gate insulating film that serves as a base of the upper gate insulating layer 42 and a metal film that serves as a base of the upper gate electrode 32 are laminated. The upper gate electrode 32 and the upper gate insulating layer 42 may be formed of the identical materials to those of the lower gate electrode 31 and the lower gate insulating layer 41 by the identical methods, and thicknesses and materials thereof may be changed as appropriate.

Thereafter, the resist mask Re is formed on the metal film that is the base of the upper gate electrode 32 by the photolithography process. The resist mask Re here is provided in a portion overlapping with the first semiconductor region 50a and the second semiconductor regions 60a illustrated in FIG. 7. Then, the metal film and the gate insulating film are etched by using a known method to be formed into the upper gate electrode 32 and the upper gate insulating layer 42 having a shape corresponding to the resist mask Re.

Figure 9E:
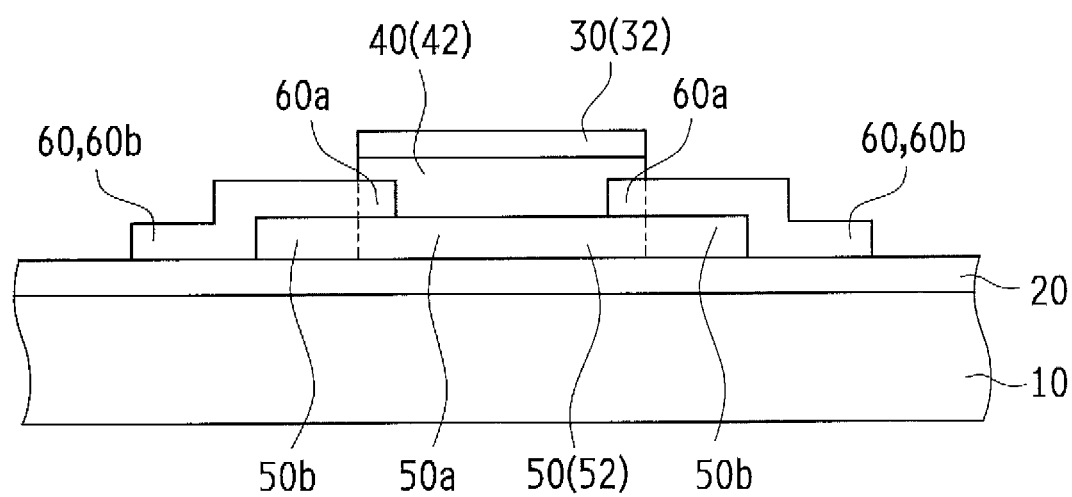
FIG. 9E is a schematic cross-sectional view illustrating the third transistor subjected to conductor forming.

FIG. 9E is a schematic cross-sectional view illustrating the third transistor subjected to conductor forming.

In the third embodiment, after the resist mask Re formed in the upper gate forming is removed, the conductor forming is performed. In other words, in the conductor forming according to the third embodiment, the upper gate electrode 32 functions as a mask in the $H_2$ plasma treatment. As a result, the first conductor region 50b and the second conductor regions 60b that are not covered by the upper gate electrode 32 are made electrically conductive, and portions directly below the upper gate electrode 32 (the first semiconductor region 50a and the second semiconductor regions 60a) are not made electrically conductive.

In the present embodiment, since the first semiconductor region 50a is provided in such a manner as to overlap with the upper gate electrode 32, the conductor forming of the first metal oxide layer 50 can be performed by using the upper gate electrode 32 as the mask, and thus the manufacturing process can be simplified. Due to this process, the first semiconductor region 50a and the second semiconductor regions 60a have a shape matching that of the upper gate electrode 32.

After the conductor forming is completed, the interlayer insulating film 70 and the terminal electrodes 80 may be formed in a substantially similar manner to that in the first embodiment, and portions where the contact holes 71 are provided and connected may be appropriately adjusted.

Fourth Embodiment

Next, with reference to the drawings, a display device according to a fourth embodiment of the disclosure will be described. Note that, in the fourth embodiment, constituent elements having functions substantially equivalent to those from the first embodiment to the third embodiment are given the same reference signs, and descriptions thereof will be omitted.

Figure 10:
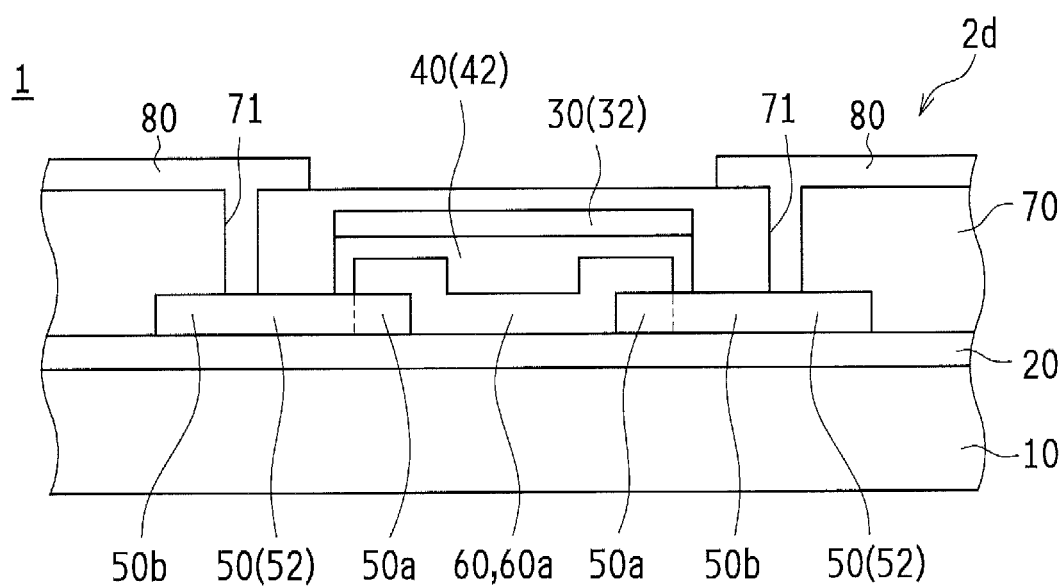
FIG. 10 is a schematic cross-sectional view schematically illustrating a fourth transistor of a display device according to a fourth embodiment of the disclosure.
Figure 11:
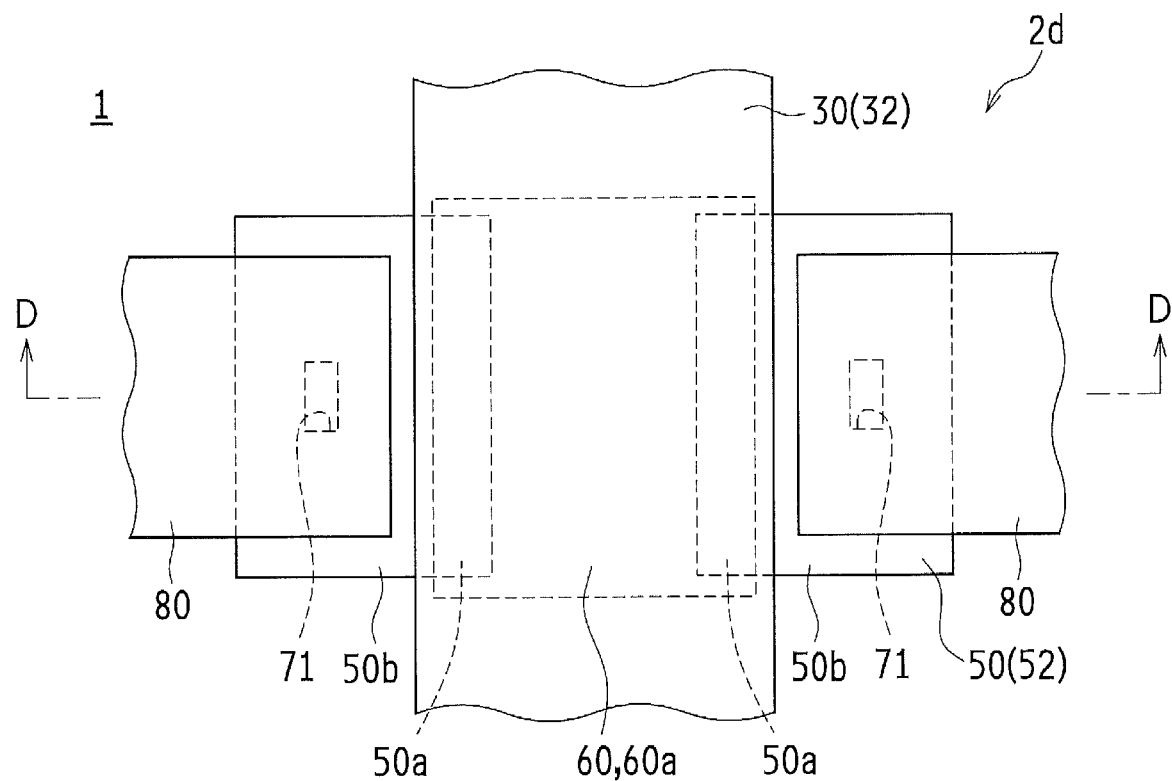
FIG. 11 is a schematic plan view of the fourth transistor illustrated in FIG. 10.

FIG. 10 is a schematic cross-sectional view schematically illustrating a fourth transistor of the display device according to the fourth embodiment of the disclosure, and FIG. 11 is a schematic plan view of the fourth transistor illustrated in FIG. 10. Note that, in view of the visibility of the drawings, hatching is omitted in FIG. 10, and the interlayer insulating film 70 and the like are perspectively illustrated in FIG. 11. Also, FIG. 10 illustrates a cross-section taken along arrow marks D-D in FIG. 11.

In the fourth embodiment, an area in which the first metal oxide layers 50 and the second metal oxide layer 60 are provided differs from that in the third embodiment. In other words, the fourth embodiment corresponds to a structure in which the upper gate electrode 32 and the upper gate insulating layer 42 are provided instead of the lower gate electrode 31 and the lower gate insulating layer 41 in the structure of the second embodiment.

Specifically, in a fourth transistor 2d, substantially similarly to the second transistor 2b, the first metal oxide layers 50 are provided on the inorganic film 20, are disposed at two divided positions for each transistor, and are provided in such a manner as to be separated in a channel length direction. The second metal oxide layer 60 is provided in such a manner as to straddle the first metal oxide layers 50 at the two positions separated from each other, and both end portions thereof in the channel length direction overlap end portions of the first metal oxide layers 50. That is, the second metal oxide layer 60 is provided in the center in the channel length direction, and is sandwiched between the first metal oxide layers 50 divided into the two positions.

Areas in which a conductor region and a semiconductor region are provided in the first metal oxide layers 50 and the second metal oxide layer 60 are substantially similar to those of the second embodiment. In other words, in the first metal oxide layer 50, a portion covered by the second metal oxide layer 60 is the first semiconductor region 50a, and the first conductor regions 50b are provided in portions extending outward from the second metal oxide layer 60 in the channel length direction. The entirety of the second metal oxide layer 60 is the second semiconductor region 60a.

A position of a boundary between the first conductor region 50b and the first semiconductor region 50a matches a position of the edge of the second metal oxide layer 60 (second semiconductor region 60a) in the channel length direction, and in FIG. 10, the boundary described above is indicated by a dashed-dotted line.

The upper gate insulating layer 42 is provided on the first metal oxide layers 50 and the second metal oxide layer 60 in a portion overlapping with the first semiconductor regions 50a and the second semiconductor region 60a, and also covers a part of the first conductor regions 50b. Specifically, the upper gate insulating layer 42 covers parts of the first conductor regions 50b near the boundaries with the first semiconductor regions 50a in the channel length direction.

The upper gate electrode 32 is provided on the upper gate insulating layer 42 in the identical area to the upper gate insulating layer 42.

The interlayer insulating film 70 is provided in such a manner as to cover the inorganic film 20, the second metal oxide layer 60, and the upper gate electrode 32, and the terminal electrodes 80 are provided on the interlayer insulating film 70. The terminal electrode 80 is connected to the first conductor region 50b of the first metal oxide layer 50 through the contact hole 71 provided in the interlayer insulating film 70.

Next, a manufacturing process of the fourth transistor will be described in detail with reference to FIGS. 12A to 12D.

Figure 12A:
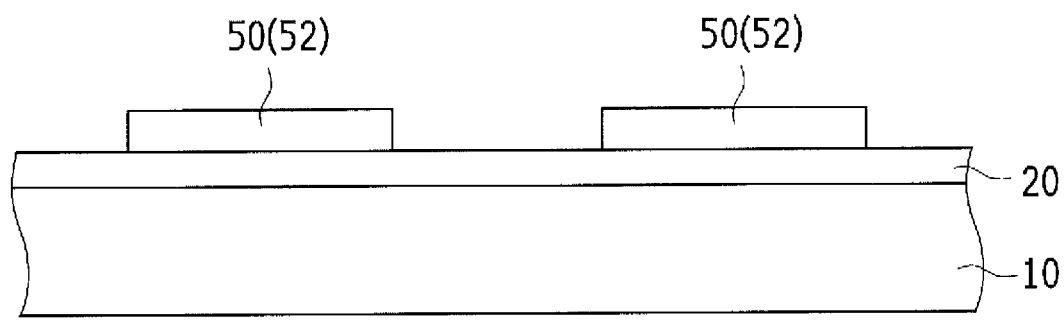
FIG. 12A is a schematic cross-sectional view illustrating the fourth transistor subjected to crystallizing.

FIG. 12A is a schematic cross-sectional view illustrating the fourth transistor subjected to crystallizing.

Since the fourth transistor 2d is manufactured in the substantially identical process to the third transistor 2c, only different portions will be described in detail, and description of common portions will be omitted. Specifically, the inorganic film 20 and the oxide semiconductor films serving as the bases of the first metal oxide layers 50 are laminated on the substrate 10 by a process common to the manufacturing method of the third transistor 2c until the crystallizing.

A detailed drawing of the first film etching in the fourth embodiment is omitted, but as illustrated in FIG. 12A, a shape of the non-crystalline first film 51 after patterning by the photolithography process is different from that of the non-crystalline first film 51 in the third transistor 2c. In other words, the non-crystalline first film 51 in the fourth transistor 2d has a shape in which the first semiconductor region 50a and the first conductor region 50b illustrated in FIG. 10 are combined, and is provided in such a manner as to be divided into two positions for each transistor. The patterned non-crystalline first film 51 is subjected to the crystallizing to be formed into the crystalline first film 52.

Figure 12B:
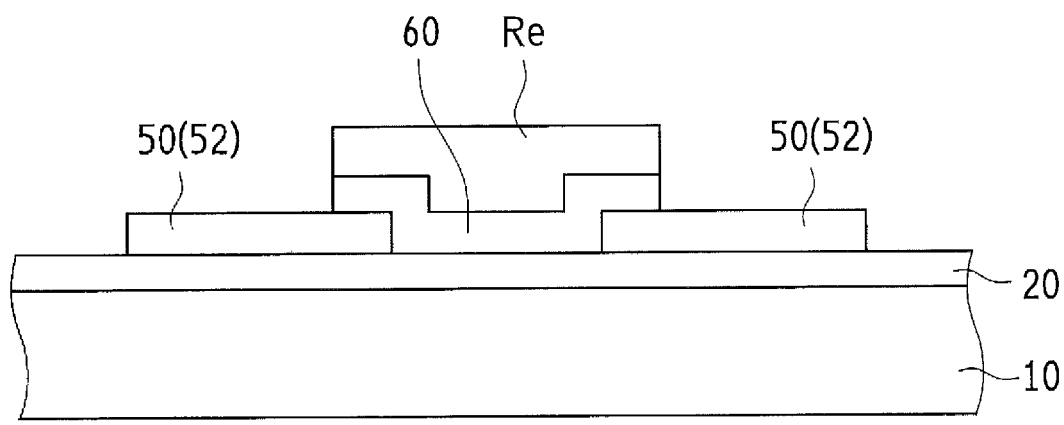
FIG. 12B is a schematic cross-sectional view illustrating the fourth transistor subjected to second film etching.

FIG. 12B is a schematic cross-sectional view illustrating the fourth transistor subjected to second film etching.

In the fourth embodiment, the second film forming substantially similar to that of the third embodiment is performed, but a shape of a resist mask Re formed in the second film etching is different. The resist mask Re to be formed here is substantially similar to that of the second embodiment, and the resist mask Re is provided in a portion overlapping with the second metal oxide layer 60 illustrated in FIG. 10. Wet etching is performed to form the second metal oxide layer 60 having a shape substantially similar to that of the second embodiment.

Figure 12C:
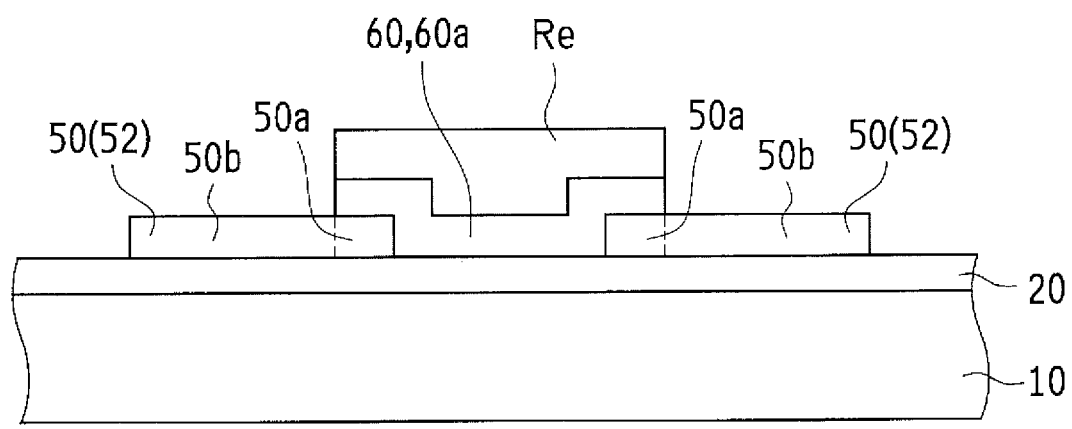
FIG. 12C is a schematic cross-sectional view illustrating the fourth transistor subjected to conductor forming.

FIG. 12C is a schematic cross-sectional view illustrating the fourth transistor subjected to conductor forming.

In the fourth embodiment, similarly to the second embodiment, the conductor forming may be performed by using the resist mask Re formed in the second film etching. Due to the conductor forming, the first metal oxide layer 50 is provided with the first conductor region 50b. In the fourth embodiment as well, similarly to the second embodiment, the second film etching and the conductor forming can be continuously performed.

Figure 12D:
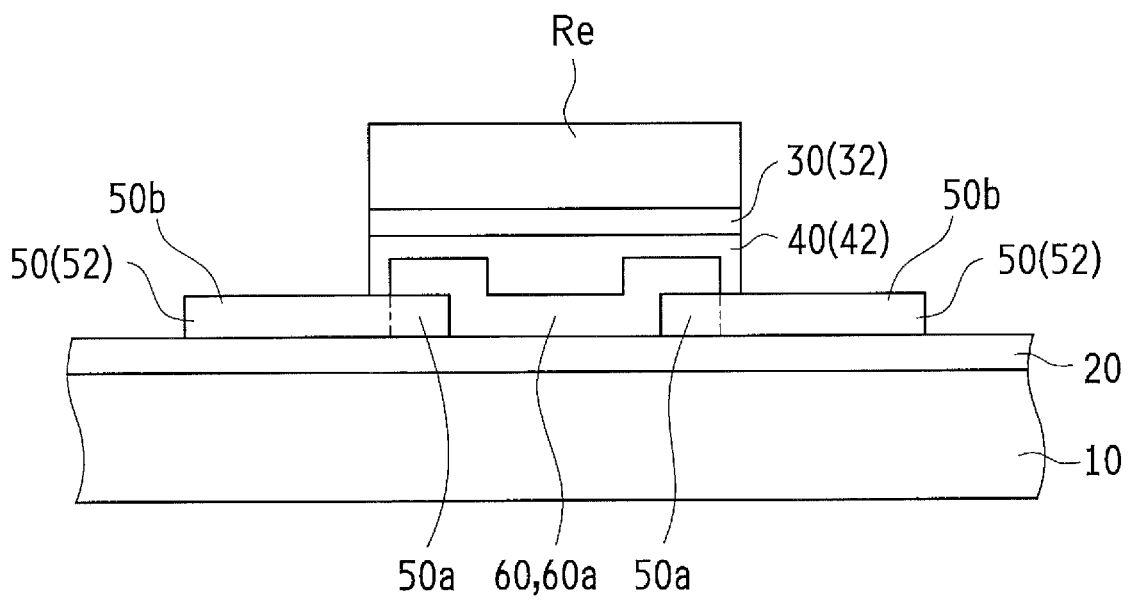
FIG. 12D is a schematic cross-sectional view illustrating the fourth transistor subjected to upper gate forming.

FIG. 12D is a schematic cross-sectional view illustrating the fourth transistor subjected to upper gate forming.

After the conductor forming is completed, the resist mask Re is removed. Next, in the upper gate forming, similarly to the third embodiment, a gate insulating film that serves as a base of the upper gate insulating layer 42 and a metal film that serves as a base of the upper gate electrode 32 are laminated. Then, patterning of the gate insulating film and the metal film by using the resist mask Re is performed to form the upper gate electrode 32 and the upper gate insulating layer 42 having a shape corresponding to the resist mask Re.

Plasma treatment may be used in etching the gate insulating film and the metal film. In the present embodiment, since the boundaries between the first semiconductor regions 50a and the first conductor regions 50b are covered by the resist mask Re, end portions of the channel region is not exposed to the plasma, and the effect on the characteristics of the transistor can be suppressed.

After the upper gate forming is completed, substantially similarly to the third embodiment, the interlayer insulating film 70 and the terminal electrodes 80 may be formed, and portions where the contact holes 71 are provided and connected may be appropriately adjusted.

Between the third transistor 2c and the fourth transistor 2d, the order in which the respective layers are laminated and the like are common, and both the third transistor 2c and the fourth transistor 2d can be formed simultaneously on the identical substrate 10. The resist mask Re in the photolithography process may be adjusted for different shapes of the respective layers.

Next, Modified Example 1 and Modified Example 2 in which a part of the structure has been modified in the fourth transistor 2d will be described with reference to the drawings.

Figure 13:
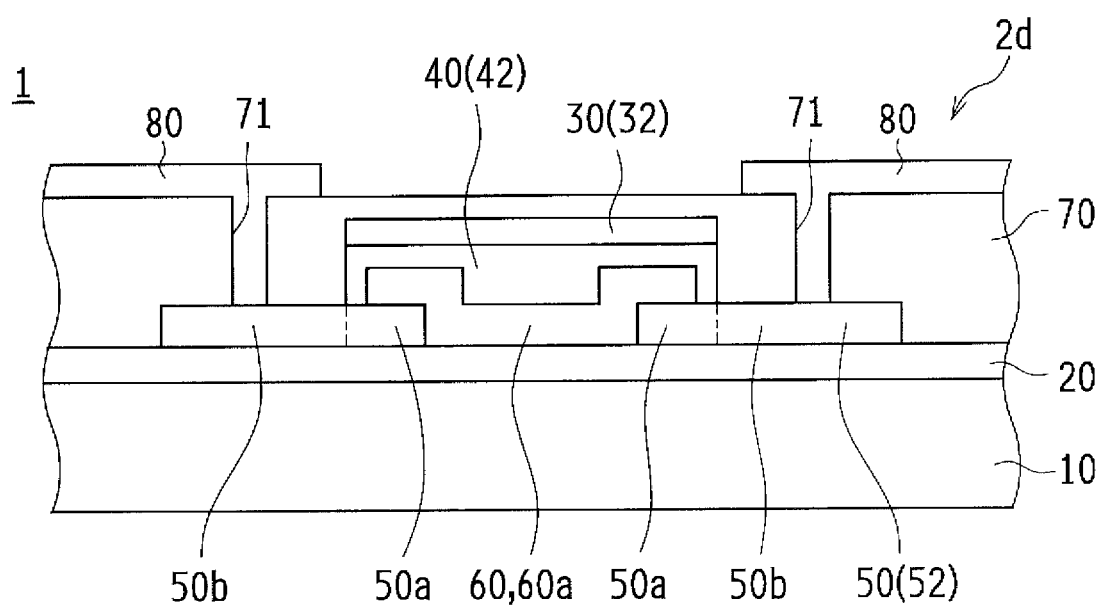
FIG. 13 is a schematic cross-sectional view schematically illustrating Modified Example 1 of the fourth transistor.

FIG. 13 is a schematic cross-sectional view schematically illustrating Modified Example 1 of the fourth transistor.

In Modified Example 1, portions where the first semiconductor regions 50a and the first conductor regions 50b are provided differ from those in the structure illustrated in FIG. 10. In FIG. 13, boundaries between the first semiconductor regions 50a and the first conductor regions 50b are indicated by dashed-dotted lines, match the upper gate electrode 32 in the channel length direction, and are slightly shifted from the end portions of the second metal oxide layer 60 (second semiconductor region 60a).

Next, a manufacturing process of Modified Example 1 will be described in detail with reference to FIGS. 14A and 14B. In Modified Example 1, until the second film etching, description and drawings are omitted because the process is similar to that of the fourth embodiment.

Figure 14A:
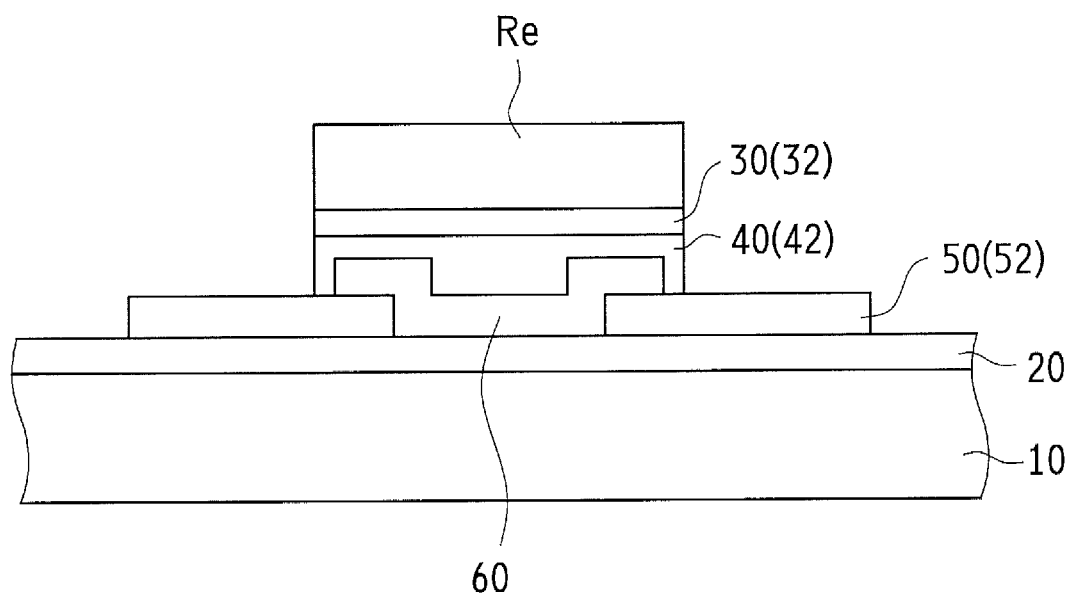
FIG. 14A is a schematic cross-sectional view illustrating Modified Example 1 of the fourth transistor subjected to upper gate forming.

FIG. 14A is a schematic cross-sectional view illustrating Modified Example 1 of the fourth transistor subjected to upper gate forming.

In Modified Example 1, after patterning of the second metal oxide layer 60, the upper gate electrode 32 is formed without conductor forming. The upper gate forming is identical to that in the fourth embodiment described above (see FIG. 12D), but the first metal oxide layers 50 are not provided with the first conductor regions 50b.

Figure 14B:
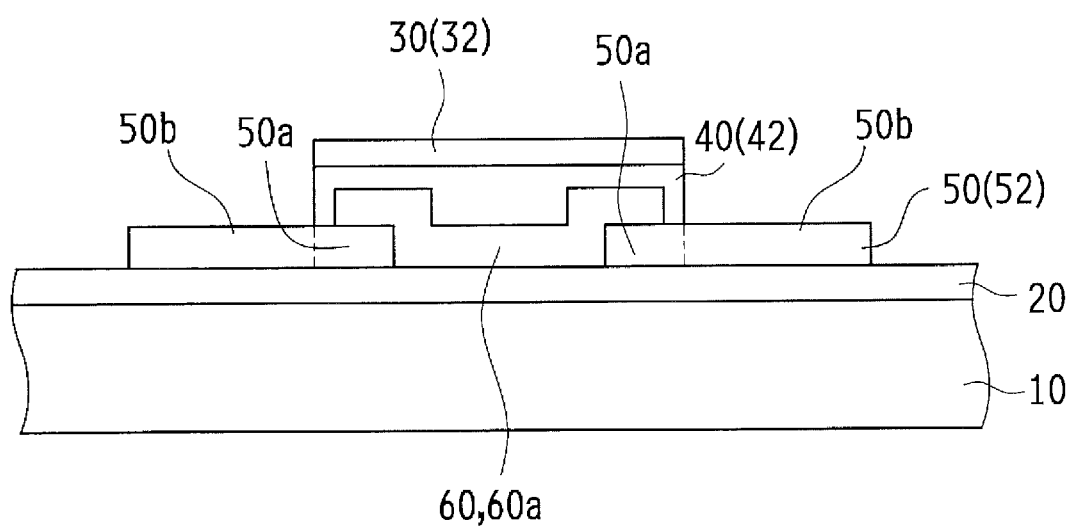
FIG. 14B is a schematic cross-sectional view illustrating Modified Example 1 of the fourth transistor subjected to conductor forming.

FIG. 14B is a schematic cross-sectional view illustrating Modified Example 1 of the fourth transistor subjected to conductor forming.

In Modified Example 1, similarly to the third embodiment, after the resist mask Re formed in the upper gate forming is removed, the conductor forming is performed. As a result, the first semiconductor region 50a has a shape matching that of the upper gate electrode 32. After the conductor forming is completed, the interlayer insulating film 70 and the terminal electrodes 80 may be appropriately formed.

As described above, in the fourth embodiment, the upper gate forming is performed after the conductor forming, but in Modified Example 1, the conductor forming is performed after the upper gate forming. In this configuration, all of the portions overlapping the upper gate electrode 32 (the first semiconductor regions 50a and the second semiconductor region 60a) serve as the channel region, and thus, the channel length can be increased.

Figure 15:
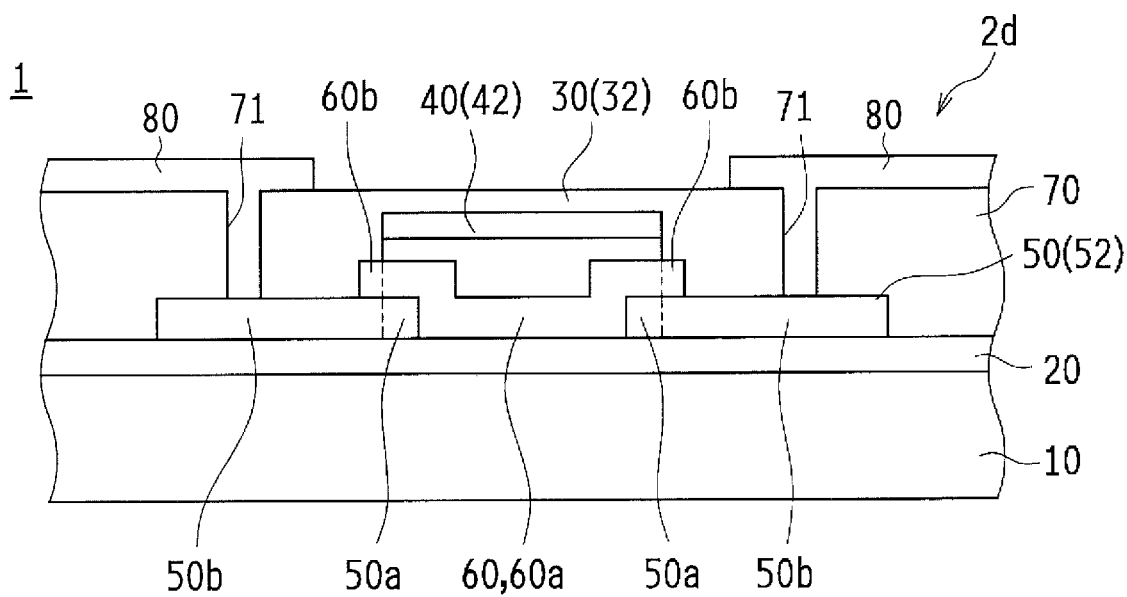
FIG. 15 is a schematic cross-sectional view schematically illustrating Modified Example 2 of the fourth transistor.

FIG. 15 is a schematic cross-sectional view schematically illustrating Modified Example 2 of the fourth transistor.

In Modified Example 2, portions where the upper gate electrode 32 and the upper gate insulating layer 42 are provided differ from those in the structure illustrated in FIG. 10. Specifically, in Modified Example 2, the upper gate electrode 32 and the upper gate insulating layer 42 are formed shorter in length in the channel length direction than the second metal oxide layer 60. Furthermore, the second metal oxide layer 60 is provided with portions that are not covered by the upper gate electrode 32 and the upper gate insulating layer 42 at both end portions. The end portions on the center sides in the channel length direction of the first metal oxide layers 50 are covered with the upper gate electrode 32 and the upper gate insulating layer 42 with the second metal oxide layer 60 interposed therebetween.

In Modified Example 2, the second semiconductor region 60a and the second conductor regions 60b are provided in the second metal oxide layer 60. A position of a boundary between the first semiconductor region 50a and the first conductor region 50b matches a position of a boundary between the second semiconductor region 60a and the second conductor region 60b in the channel length direction, and in FIG. 15, the boundaries described above are indicated by a dashed-dotted line. A portion covered by the upper gate electrode 32 and the upper gate insulating layer 42 overlaps with the first semiconductor regions 50a and the second semiconductor region 60a.

Next, a manufacturing process of Modified Example 2 will be described in detail with reference to FIGS. 16A and 16B. In Modified Example 2, description and drawings are omitted because a process until the second film etching is similar to that in the fourth embodiment.

Figure 16A:
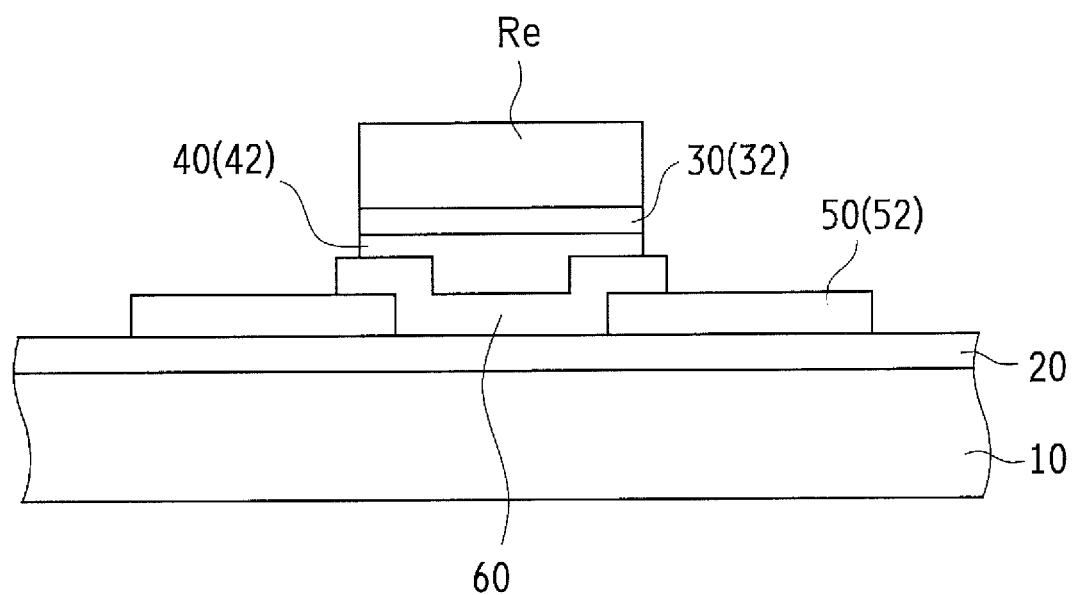
FIG. 16A is a schematic cross-sectional view illustrating Modified Example 2 of the fourth transistor subjected to upper gate forming.

FIG. 16A is a schematic cross-sectional view illustrating Modified Example 2 of the fourth transistor subjected to upper gate forming.

In Modified Example 2, after patterning of the second metal oxide layer 60, the upper gate electrode 32 is formed without conductor forming. The resist mask Re in the patterning of the upper gate electrode 32 covers a slightly narrower area than the second metal oxide layer 60 in the channel length direction. Thereafter, the upper gate electrode 32 and the upper gate insulating layer 42 having a shape corresponding to the resist mask Re are formed by patterning.

Figure 16B:
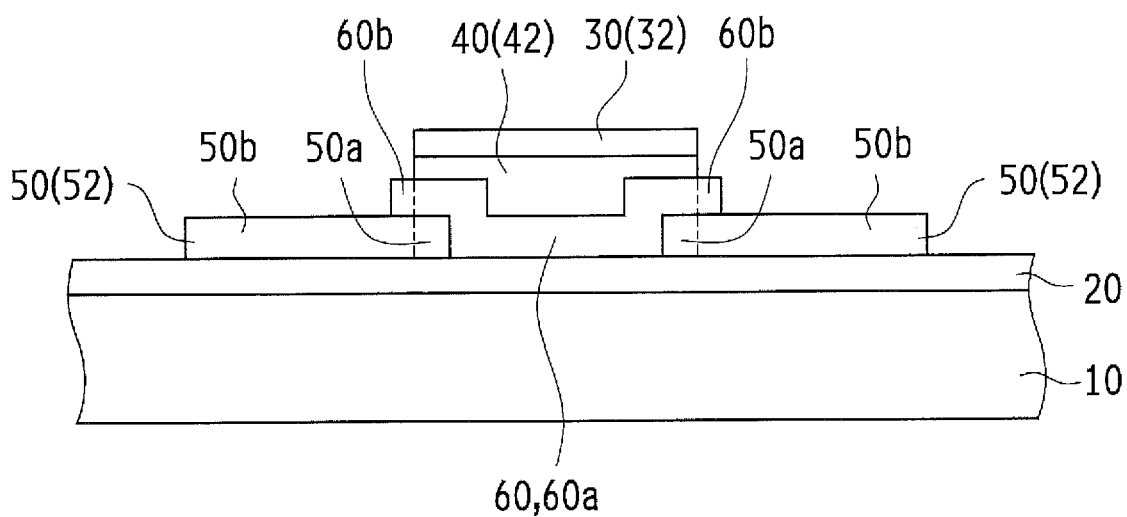
FIG. 16B is a schematic cross-sectional view illustrating Modified Example 2 of the fourth transistor subjected to conductor forming.

FIG. 16B is a schematic cross-sectional view illustrating Modified Example 2 of the fourth transistor subjected to conductor forming.

In Modified Example 2, similarly to the third embodiment, after the resist mask Re formed in the upper gate forming is removed, the conductor forming is performed. As a result, the first semiconductor regions 50a and the second semiconductor region 60a have a shape matching that of the upper gate electrode 32. After the conductor forming is completed, the interlayer insulating film 70 and the terminal electrodes 80 may be appropriately formed.

Next, a display device including transistors will now be described with reference to the drawings.

Figure 17:
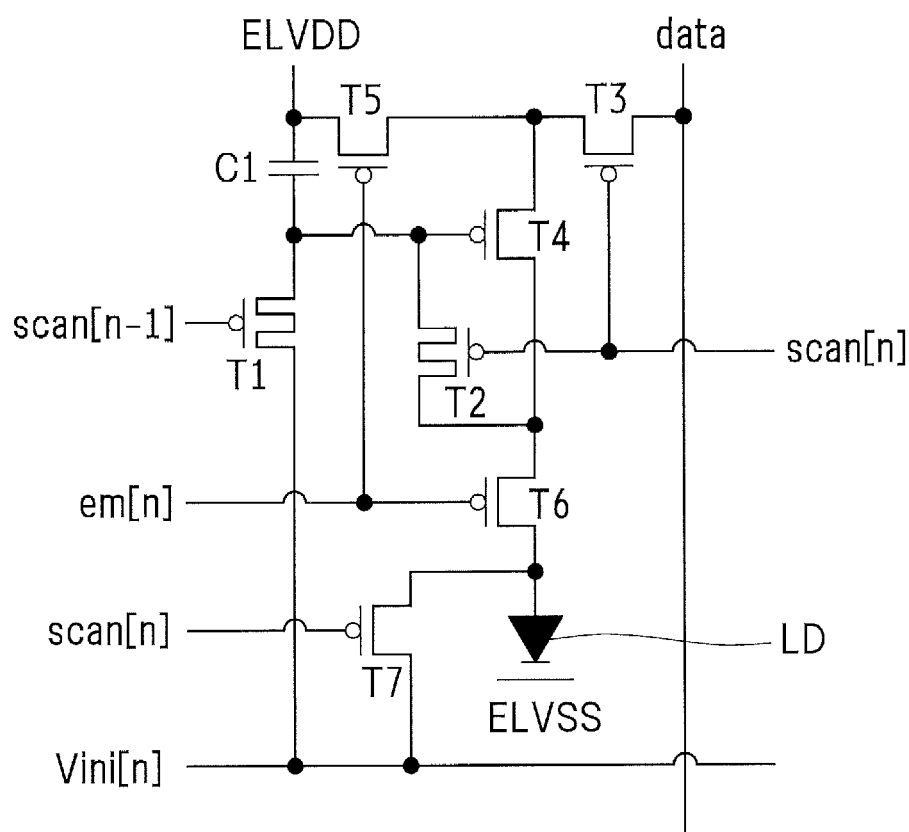
FIG. 17 is an equivalent circuit diagram illustrating a pixel circuit of a display device.

FIG. 17 is an equivalent circuit diagram illustrating a pixel circuit of a display device.

The display device includes a display region configured of a plurality of pixels arrayed in a matrix shape. The plurality of pixels typically includes red pixels that display red, green pixels that display green, and blue pixels that display blue.

In each pixel, a corresponding light emitting diode LD is provided, and is controlled by a corresponding pixel circuit.

FIG. 17 illustrates an example of a pixel circuit, and is configured of a combination of seven transistors (from first circuit transistor T1 to seventh circuit transistor T7), a capacitor C1, and a light emitting diode LD. Each of the first transistor 2a to the fourth transistor 2d described above may be applied to any of the first circuit transistor T1 to the seventh circuit transistor T7, but is preferably disposed at a position corresponding to the respective characteristics.

For example, in a drive transistor (fourth circuit transistor T4) that supplies power to the light emitting diode LD, an S value is desirably small, and a transistor including the second semiconductor region 60a (for example, the second transistor 2b) is preferably applied. In addition, since an initialization transistor (the first circuit transistor T1) that initializes a voltage of the drive transistor, and a threshold voltage compensation transistor (the second circuit transistor T2) that compensates for a threshold voltage of the drive transistor are connected to the capacitor C1, current leakage is desirably small, and a transistor including the second semiconductor region 60a (for example, the second transistor 2b) is preferably applied. Other transistors, especially a write transistor (the third circuit transistor T3), are transistors that function as switching, and transistors including the first semiconductor region 50a (for example, the first transistor 2a) are preferably applied. In this manner, the performance of the display device can be improved by using the first transistor 2a and the second transistor 2b depending on the respective characteristics.

Note that when the third transistor 2c and the fourth transistor 2d are compared, the third transistor 2c has similar characteristics to the first transistor 2a, and the fourth transistor 2d has similar characteristics to the second transistor 2b. In other words, the third transistor 2c may be applied instead of the first transistor 2a, and the fourth transistor 2d may be applied instead of the second transistor 2b.

The display device 1 according to the present embodiment is not particularly limited as long as the display device is a display panel including display elements. Examples of the display elements include optical elements having luminance or transmittance controlled by current and optical elements having luminance or transmittance controlled by voltage. Examples of the display elements controlled by current include organic Electro Luminescent (EL) displays equipped with Organic Light Emitting Diodes (OLED), EL displays such as inorganic EL displays equipped with inorganic light emitting diodes, Quantum dot Light Emitting Diode (QLED) displays equipped with QLEDs, and the like. Further, examples of the display elements controlled by voltage include liquid crystal display elements, and the like.

Note that the presently disclosed embodiments are illustrative in all respects, and do not become a basis of limited interpretation. Accordingly, the technical scope of the disclosure is not to be interpreted only by the above-described embodiments, but is defined based on the description of the claims. In addition, all modifications within the meaning and scope equivalence to the scope of the claims are included.

The invention claimed is:

1. A display device comprising:
at least one transistor,
wherein the at least one transistor has a configuration including a gate electrode, a gate insulating film, a first metal oxide layer having crystallinity, and a second metal oxide layer having non-crystallinity,
the first metal oxide layer and the second metal oxide layer are laminated on a substrate in this order,
the first metal oxide layer and the second metal oxide layer are in contact with each other in all regions where the first metal oxide layer and the second metal oxide layer overlap each other,
the first metal oxide layer, at least partially, has a first semiconductor region serving as a semiconductor,
one of the first metal oxide layer and the second metal oxide layer, at least partially, has a conductor region made electrically conductive,
the second metal oxide layer, at least partially, has a second semiconductor region serving as a second semiconductor,
the first metal oxide layer has the conductor region,
the first semiconductor region is divided into a source region side and a drain region side so as to be paired with the conductor region in the first metal oxide layer, and
at least a part of the second semiconductor region is sandwiched between the first semiconductor region on the source region side and the first semiconductor region on the drain region side.

2. The display device according to claim 1,
wherein the first metal oxide layer is formed of a ternary oxide semiconductor containing at least tungsten or tin.

3. The display device according to claim 1,
wherein the second metal oxide layer is formed of a ternary oxide semiconductor containing at least tungsten or tin.

4. The display device according to claim 1,
wherein the first metal oxide layer and the second metal oxide layer are formed of an identical material.

5. The display device according to claim 1,
wherein an edge between the conductor region and the first semiconductor region in the first metal oxide layer matches an edge of the second metal oxide layer.

6. The display device according to claim 1,
wherein the second metal oxide layer has the conductor region, and
an edge between the conductor region and the first semiconductor region in the first metal oxide layer matches an edge of the conductor region and the second semiconductor region in the second metal oxide layer.

7. The display device according to claim 1,
wherein the first metal oxide layer is sandwiched between the substrate and the gate electrode, and
the first semiconductor region has a shape matching the gate electrode.

8. The display device according to claim 7,
wherein the second semiconductor region has a shape matching the gate electrode.

9. The display device according to claim 1,
wherein the gate electrode is sandwiched between the substrate and the first metal oxide layer, and
in a channel length direction in which a source region and a drain region face each other, a width of the gate electrode is larger than a width of the first semiconductor region or the second semiconductor region.

10. The display device according to claim 1, further comprising:
an interlayer insulating film and a terminal electrode laminated on the second metal oxide layer,
wherein the terminal electrode is electrically connected to the conductor region through a contact hole formed in the interlayer insulating film.

11. A display device comprising:
at least one transistor,
wherein the at least one transistor has a configuration including a gate electrode, a gate insulating film, a first metal oxide layer having crystallinity, and a second metal oxide layer having non-crystallinity,
the first metal oxide layer and the second metal oxide layer are laminated on a substrate in this order,
the first metal oxide layer and the second metal oxide layer are in contact with each other in all regions where the first metal oxide layer and the second metal oxide layer overlap each other,
the first metal oxide layer, at least partially, has a first semiconductor region serving as a semiconductor,
one of the first metal oxide layer and the second metal oxide layer, at least partially, has a conductor region made electrically conductive,
the second metal oxide layer, at least partially, has a second semiconductor region serving as a second semiconductor,
the at least one transistor comprises a first transistor and a second transistor provided on the substrate,
in the first transistor, the second semiconductor region is divided into a first source region side and a first drain region side,
the first semiconductor region is positioned between the divided second semiconductor regions serves as a channel region,
in the second transistor, the first semiconductor region is divided into a second source region side and a second drain region side, and
the second semiconductor region is positioned between the divided first semiconductor regions serves as a channel region.

12. The display device according to claim 11,
wherein the first transistor serves as a write transistor, and the second transistor serves as a drive transistor.

13. The display device according to claim 12,
wherein the second transistor further serves as an initialization transistor configured to initialize a voltage of the drive transistor, and
the second transistor further serves as a threshold voltage compensation transistor configured to compensate for a threshold voltage of the drive transistor.

14. The display device according to claim 11,
wherein the first metal oxide layer is formed of a ternary oxide semiconductor containing at least tungsten or tin.

15. The display device according to claim 11,
wherein the second metal oxide layer is formed of a ternary oxide semiconductor containing at least tungsten or tin.

16. The display device according to claim 11,
wherein the first metal oxide layer and the second metal oxide layer are formed of an identical material.

17. The display device according to claim 11,
wherein the first metal oxide layer is sandwiched between the substrate and the gate electrode, and
the first semiconductor region has a shape matching the gate electrode.

18. The display device according to claim 17,
wherein the second semiconductor region has a shape matching the gate electrode.

19. The display device according to claim 11,
wherein the gate electrode is sandwiched between the substrate and the first metal oxide layer, and
in a channel length direction in which a source region and a drain region face each other, a width of the gate electrode is larger than a width of the first semiconductor region or the second semiconductor region.

20. The display device according to claim 11, further comprising:
an interlayer insulating film and a terminal electrode laminated on the second metal oxide layer,
wherein the terminal electrode is electrically connected to the conductor region through a contact hole formed in the interlayer insulating film.

* * * * *